United States Patent [19]

Konishi

[11] Patent Number: 4,592,028

[45] Date of Patent: May 27, 1986

[54] MEMORY DEVICE

[75] Inventor: Satoshi Konishi, Tokyo, Japan

[73] Assignee: Tokyo Shibaura Denki Kabushiki Kaisha, Kawasaki, Japan

[21] Appl. No.: 502,338

[22] Filed: Jun. 8, 1983

[30] Foreign Application Priority Data

Jun. 9, 1982 [JP] Japan ................................ 57-99002
Jun. 9, 1982 [JP] Japan ................................ 57-99006

[51] Int. Cl.⁴ ........................................... G11C 11/40
[52] U.S. Cl. ................................. 365/230; 365/189; 307/530
[58] Field of Search ....................... 365/189, 230, 233; 357/530

Primary Examiner—Terrell W. Fears
Attorney, Agent, or Firm—Schwartz, Jeffery, Schwaab, Mack, Blumenthal & Evans

[57] ABSTRACT

A memory device such as a random-access memory in which in response to an input signal such as an address signal, two signals having the opposite logical relationship with each other generated from the input signal and delayed with respect to the input signal are applied to a detector for detecting the transition of the input signal, whereby address transition detector signal having normal time relationship with the address signal can be obtained even when the address signal changes very slowly.

19 Claims, 33 Drawing Figures

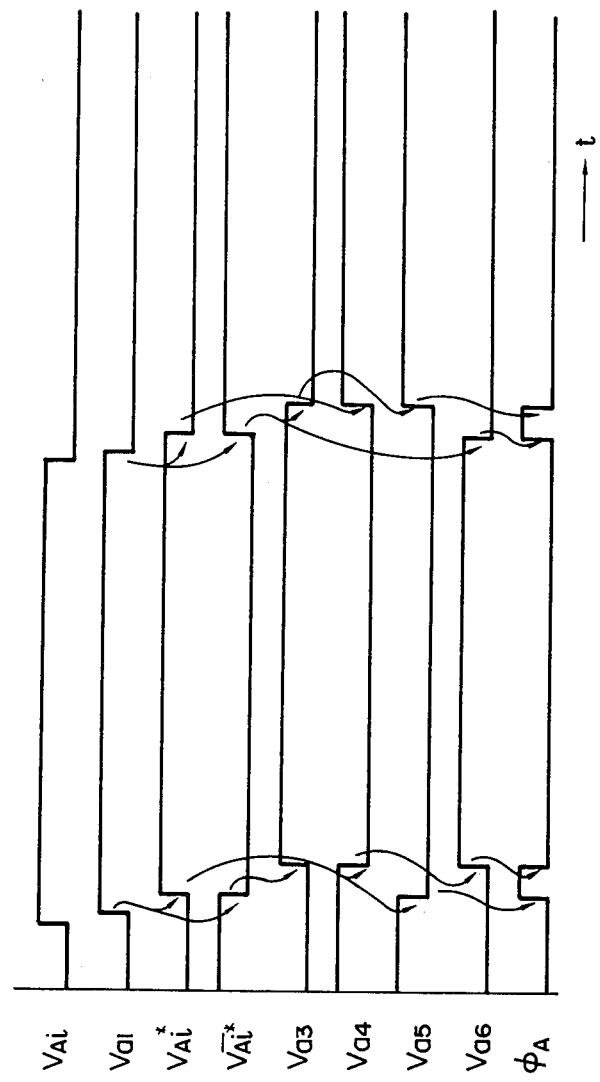

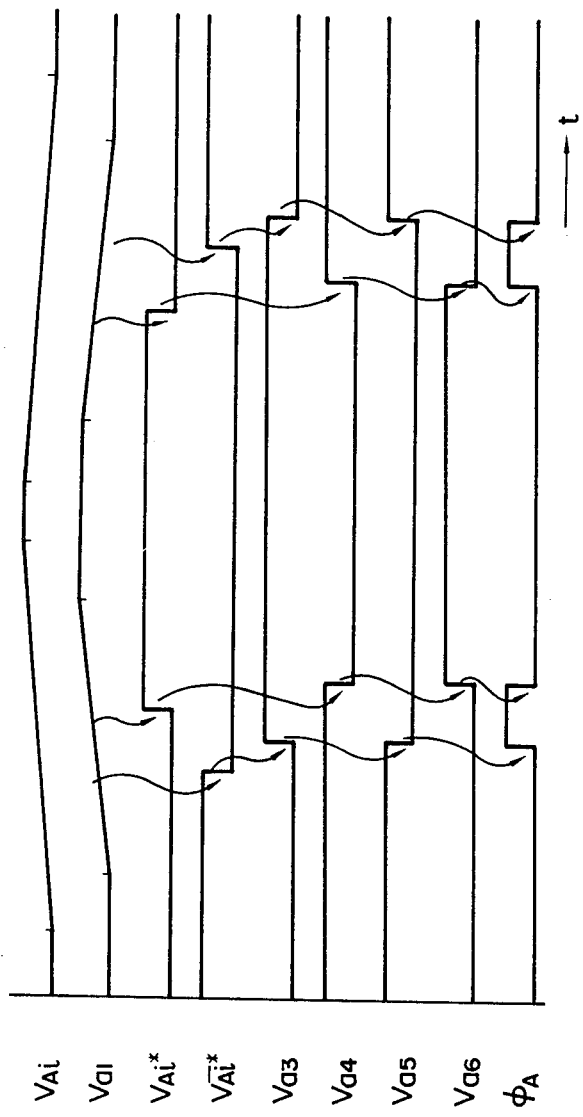

MEMORY DEVICE

BACKGROUND OF THE INVENTION

The present invention relates to a memory device.

A system with a static circuit such as a static random-access memory must operate for an address input which changes very slowly so that it has more difficult problems than dynamic random-access memories. That is, erratic operations to select wrong or undesired addresses tend to occur very frequently.

There have been proposed various methods for preventing such erratic operations, but they have not been satisfactory in practice.

SUMMARY OF THE INVENTION

The primary object of the present invention is therefore to provide a static memory device which can avoid erratic operations even when an address input signal changes very slowly.

According to the present invention, two output signals which are derived from an address buffer and applied to a decoder of a memory device and which have the opposite logical relationship with each other are applied to a signal transition detector circuit (to be referred to as "STDC" in this specification) in such a way that the pulse duration of an output pulse $\phi_A$ of STDC will last beyond the selection time of the decoder.

BRIEF DESCRIPTION OF THE DRAWINGS

FIG. 9 is a timing chart used to explain the operation thereof when the address input signal changes rapidly;

FIG. 10 is a timing chart used to explain the operation thereof when the address input signal changes very slowly;

DETAILED DESCRIPTION OF THE INVENTION

Figure 1:
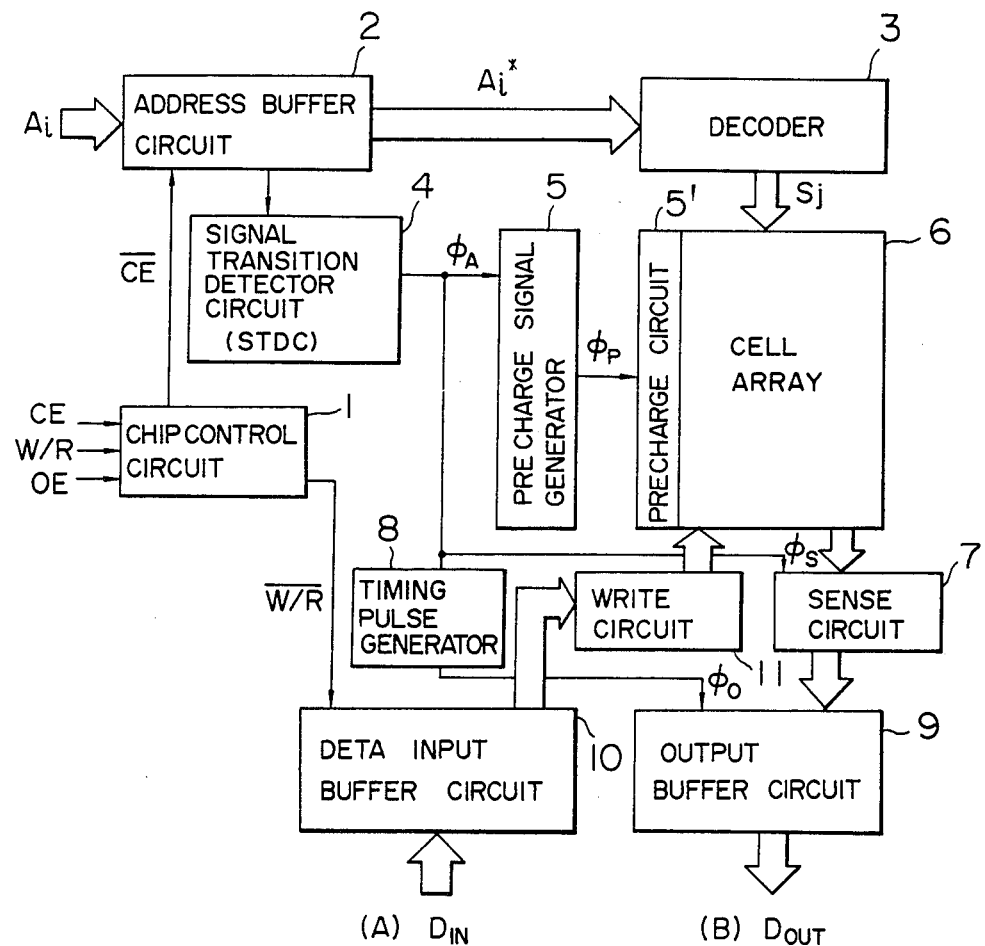
FIG. 1 is a block diagram used to explain the flow of internal control signals in a conventional static memory device.

In a memory device, especially in a static random-access memory (to be referred to as "a static RAM" in this specification), data signals flow as shown in FIG. 1.

In the case of READ mode, an internal chip enable signal is delivered from a chip control circuit 1 to an address buffer circuit 2 so that the buffer circuit 2 is enabled. The address buffer circuit 2 converts an address input signal Ai (where i=0, 1, 2, ..., and N) into two address signal outputs Ai* and $\overline{\text{Ai}}$*, in the opposite logical states to each other, where they are designated by Ai*. As to the next stage they are delivered to a decoder 3. The voltage transition of the address input signal Ai is detected by STDC 4 and its output $\phi_A$ becomes an internal control signal of the memory device and is delivered as a bit line precharge signal $\phi_p$ for preparing the readout of the data stored in a memory cell, to a precharge circuit 5' through a precharge signal generator 5. The precharge circuit 5' is connected to a cell array 6 including memory cells. It is also delivered as a bit line sense control signal $\phi_s$ for sensing the data stored in a memory cell, to a sense circuit 7. It is further delivered as an output buffer circuit control signal $\phi_o$ to an output buffer circuit 9 through a timing signal generator 8. A decoder output Sj from a decoder 3 is delivered as a memory-cell-selection signal to the cell array 6. In response to the selection signal, data stored in the selected memory cell are read out, amplified by a sense circuit 7, adjusted or controlled by the output buffer circuit 9 so that the timing for READ mode may be controlled, and then delivered as a data output signal Dout.

In the case of WRITE mode, in addition to the above-described operation, a write/read selection signal W/R applied to the chip control circuit 1 activates a data input buffer circuit 10 so that the buffer circuit 10 can receive a data input signal $D_{IN}$. The input signal $D_{IN}$ is then stored through a write circuit 11 into a selected memory cell.

FIG. 2 shows the constructions of the address buffer circuit 2, the decoder 3 and STDC 4.

Figure 2A:
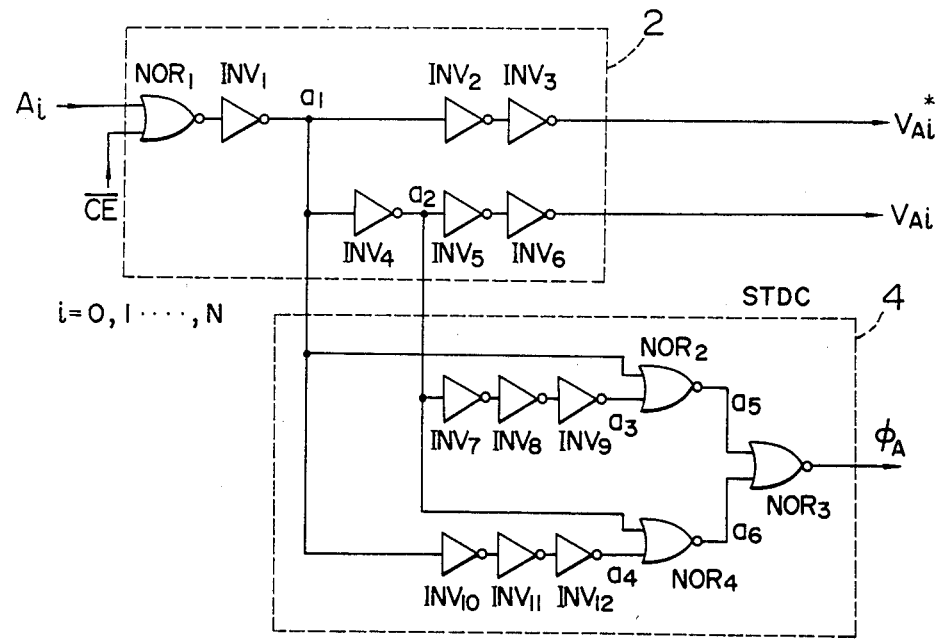
FIG. 2, including 2(a)–2(c), is a circuit diagram of a conventional address buffer, STDC and a conventional decoder.

In the address buffer circuit 2 as shown in FIG. 2(a), a NOR gate $NOR_1$ which receives both the address input signal Ai and the internal chip enable signal $\overline{CE}$ is connected to an input of an inverter $INV_1$, and two series-connected inverters $INV_2$ and $INV_3$ and three series-connected inverters $INV_4$, $INV_5$ and $INV_6$ are connected in parallel to each other to a node a1 of the output of the inverter $INV_1$.

Figure 2B:
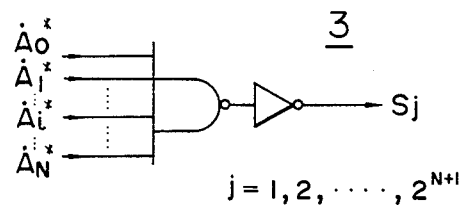
Figure 2C:
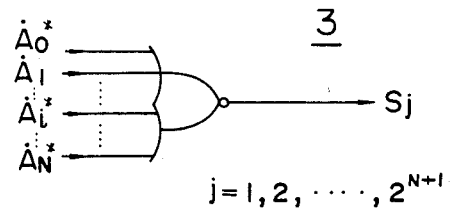

The outputs Ai* and $\overline{Ai}$* of the opposite logical states from the address buffer circuit 2 are delivered to the decoder 3. The decoder 3 may be of the type as shown in FIG. 2(b) or the type as shown in FIG. 2(c). The decoder 3 of the type as shown in FIG. 2(a) comprises a NAND gate and an inverter so that it is enabled when all the input signals are high. The decoder 3 of the type as shown in FIG. 2(c) comprises a NOR gate which is enabled when all the inputs are low.

STDC 4 comprises a NOR gate $NOR_2$ which receives the outputs from the node a1 and a node a2 between the inverters $INV_4$ and $INV_5$ of the address buffer cicuit 2 through three series-connected inverters $INV_7$, $INV_8$ and $INV_9$; a NOR gate 3 which receives the outputs from the node a2 and the output from the node a1 through three series-connected inverters $INV_{10}$, $INV_{11}$ and $INV_{12}$; and a NOR gate $NOR_4$ which receives the outputs from the NOR gates $NOR_2$ and $NOR_3$. The output of STDC is the gate output $\phi_A$ of the NOR gate $NOR_4$.

Figure 3:
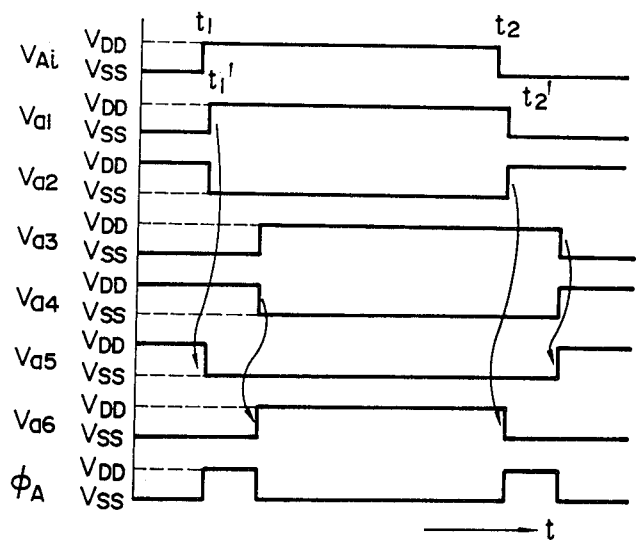
FIG. 3 is a timing chart used to explain the operation of the conventional STDC.

FIG. 3 shows the waveforms at various nodes of STDC during the operation. When the chip is selected and the $\overline{CE}$ signal is low, NOR gate $NOR_1$ functions as an inverter with respect to the address input signal Ai. At time t1, the address input signal $V_{Ai}$ rises from a low level to a high level. Then at time t1' delayed a little from the time t1, the signal $V_{a1}$ at the node a1 rises from a low level to a high level while the signal $V_{a2}$ at the node a2 falls from a high level to a low level. The rise of the signal $V_{a1}$ is delayed through the inverter train from $INV_{10}$ to $INV_{12}$ and appears as a fall of the signal $V_{a4}$. The fall of the signal $V_{a2}$ is delayed through the inverter train from $INV_7$ to $INV_9$ so that the rise of the signal $V_{a3}$ appears. Therefore, the signal $V_{a5}$ at the output node a5 of the NOR gate $NOR_2$ which receives the signals $V_{a1}$ and $V_{a3}$ falls immediately as the signal $V_{a1}$ rises. The signal $V_{a6}$ at the output node a6 of NOR gate $NOR_3$ which receives the signals $V_{a2}$ and $V_{a4}$ rises as the signal $V_{a4}$ falls. As a result, the output $\phi_A$ of NOR gate $NOR_4$ which receives the signals $V_{a5}$ and $V_{a6}$ becomes a pulse with a predetermined pulse width. That is, the output $\phi_A$ of STDC becomes the signal for detecting the transition of an address input signal. The output $\phi_A$ is also used to generate the bit line precharge signal $\phi_p$, the bit line sense control signal $\phi_s$ and the output buffer control signal $\phi_o$.

Figure 4:
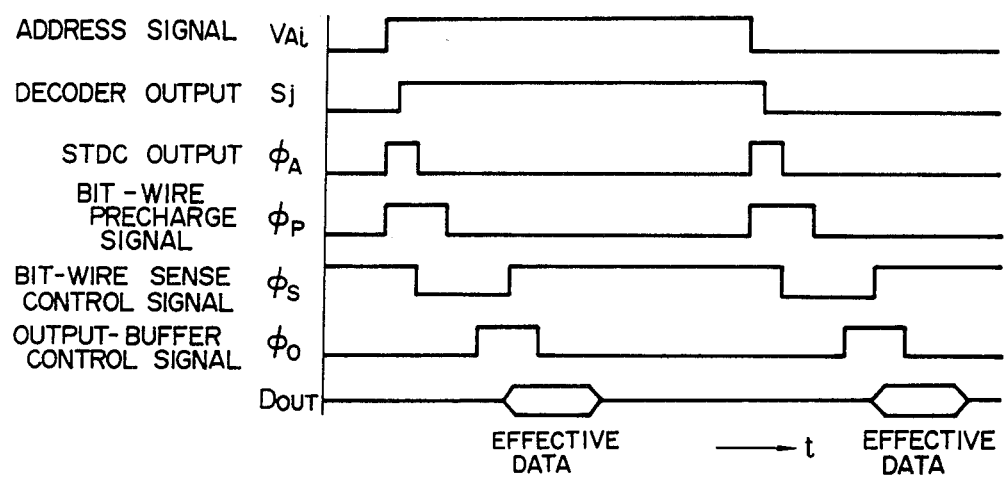
FIG. 4 is a timing chart showing the relationships among various internal control signals of the static memory device when the normal read operation is carried out.

FIG. 4 is a timing chart showing the relationship among the address signal $V_{Ai}$, the decoder output Sj, STDC output $\phi_A$, the bit line precharge signal $\phi_p$, the bit line sense control signal $\phi_s$, the output buffer control signal $\phi_o$ and the data output signal Dout. It is seen that almost simultaneously with the voltage change in the address signal $V_{Ai}$, the output $\phi_A$ of STDC becomes a pulse with a predetermined pulse width. Then, the bit line precharge signal $\phi_p$, the pit line sense control signal $\phi_s$ and the output buffer control signal $\phi_o$ are generated so that the preparation for reading a bit line data, the amplification of data read out from a memory cell and the timing control of the output data are effected. The decoder output Sj (where j = 1, 2, ..., and $2^{N+1}$) is used to select a group of memory cells connected to a common word line. In order to prevent erratic operation, it must be generated a little time after bit lines have been precharged in response to the bit precharge signal $\phi_p$. Therefore, Sj, $\phi_s$ and $\phi_o$ must be maintained in a predetermined time relationship.

In order to avoid erratic decoder selections, the so-called multi-access must be avoided in which in response to the output from the address buffer circuit 2, the decoder 3 selects a plurality of word lines or bit lines. One of the reasons why multi-access occurs is that two output signals Ai* and $\overline{Ai}$* from the address buffer circuit 2 remain an intermediate level between a high potential level and a low potential level for some time duration so that the decoder 3 takes the intermediate level signal as the same logical level and consequently at least two decoders are simultaneously activated. When a plurality of decoders are simultaneously activated, because of a plurality of memory cells being interconnected to each other through bit or data wires, a plurality of memory cells interfere with each other. As a result, data stored in them are destroyed and consequently the erratic operation occurs in which erratic data are read out and stored. Such erratic operation tends to occur when the potential change in address signal is so slow that a plurality of decoders are simultaneously activated for a relatively long time duration.

Figure 5A:
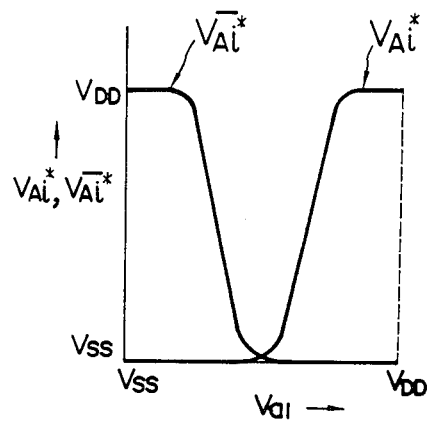
FIG. 5, including 5(a) and 5(b), shows the input-output characteristics used to explain the operation of the address buffer for preventing the multi-access to memory cells.
Figure 5B:
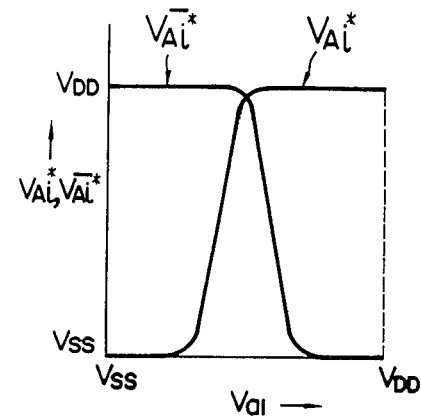

In order to prevent multi-access, the conductance of driving transistors and load transistors of the inverters $INV_2$ through $INV_6$ of the address buffer circuit 2 is designed, such that the two outputs Ai* and $\overline{Ai}$* of the address buffer 2 should not simultaneously be in an intermediate level in response to which the decoder 3 is activated. As a result, the two output signals $V_{Ai*}$ and $V_{\overline{Ai}*}$ change with respect to the address input signal $V_{Ai}$ as shown in FIG. 5. That is, as the signal $V_{Ai}$ rises from a low level (Vss) to a high level ($V_{DD}$), $V_{Ai*}$ changes L→L→H while $V_{\overline{Ai}*}$ changes H→L→L as shown in FIG. 5(a) for the decoder which is activated by the high-level signal as shown in FIG. 2(b). For the decoder which is activated by the low-level signal as shown in FIG. 2(c), $V_{Ai*}$ changes L→H→H while $V_{\overline{Ai}*}$ changes H→H→L as shown in FIG. 5(b).

Problems of the Prior Art

Erratic operations of the memory device of the type described above occur very often.

Figure 6:
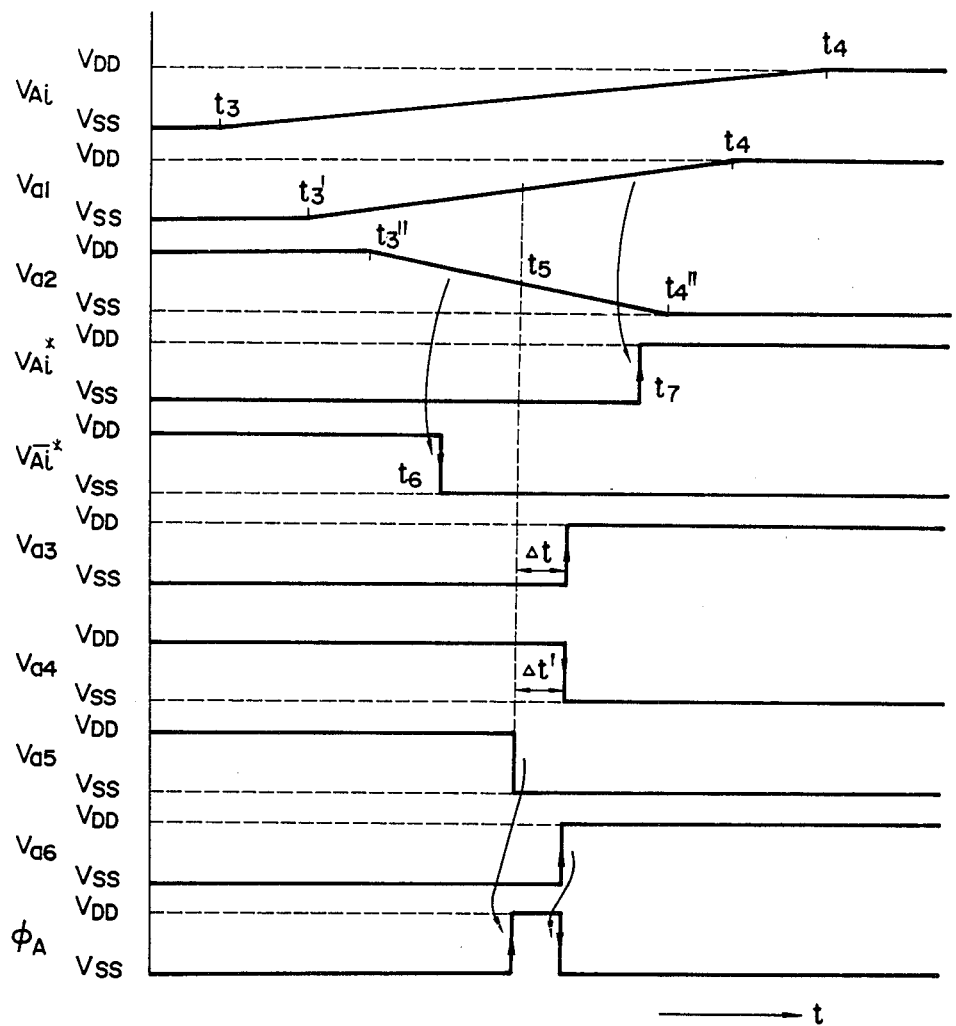
FIG. 6 is a timing chart used to explain the operation of STDC when the address input signal changes very slowly.

For instance, assume that the address buffer circuit 2 and STDC 4 as shown in FIG. 2(a) consist of complementary MOS transistors and that the address voltage signal $V_{Ai}$ very slowly changes from a low level (Vss) to a high level ($V_{DD}$) from time t3 to t4 as shown in FIG. 6. Then since the voltage signal $V_{Ai}$ is transferred through NOR gate $NOR_1$ and the inverter $INV_1$, the voltage at the node a1 rises from a low level to a high level faster than the voltage $V_{Ai}$ from t3' to t4' and the voltage at the node a2 falls from a high level to a low level from t3" to t4" faster than does the voltage $V_{Ai}$. In order to avoid multi-access, when the decoder 3 generates a high level enable signal as shown in FIG. 2(b), the voltages $V_{Ai*}$ and $V_{\overline{Ai}*}$ must satisfy the relationship as shown in FIG. 5(a). To keep such relationship, the driving and load transistors of the inverters $INV_2$ through $INV_6$ must be designed to have different conductance ratio of driving transistors and load ones each other, whereby the voltage $V_{\overline{Ai}*}$ changes from a high level to a low level at a time t6 earlier than the time t5 which is the intermediate time between the times t3" and t4" when the voltage $V_{a2}$ has the central voltage value, while the voltage $V_{Ai*}$ changes from a low level to a high level at the time t7 later than the time t5 when $V_{a1}$ has the central voltage value.

On the other hand, STDC must have the same response as the input signals, i.e. the voltage signals at the nodes a1 and a2 regardless of their falling or rising waveforms. Therefore, the inverters $INV_7$ and $INV_{12}$ have to be designed that they reverse their states at the time t5 when the voltage $V_{a1}$ and $V_{a2}$ become an intermediate voltage.

As a result, the voltage at the node a3 changes at the time $\Delta t$ after the time t5 because of the signal transfer delay at the inverter train $INV_7$ through $INV_9$, and the voltage at the node a4 changes at the time $\Delta t'$ after the time t5 because of the delay at the inverter train $INV_{10}$ through $INV_{12}$. The voltage at the node a5; that is, the output of NOR gate $NOR_2$ which receives the voltages at the nodes a1 and a3 changes from a high level to a low level at the time t5. The voltage at the node a6; that is, the output of NOR gate $NOR_3$ which receives the voltages at the nodes a2 and a4 changes from a low level to a high level at the time $\Delta t'$ after the time t5. Therefore, the output $\phi_A$ of STDC; that is, the output of NOR gate $NOR_4$ which receives the voltages at the nodes a5 and a6 becomes a one-shot pulse which rises to a high level at the time t5 and falls to a low level at the time $\Delta t'$ after the time t5.

Figure 7:
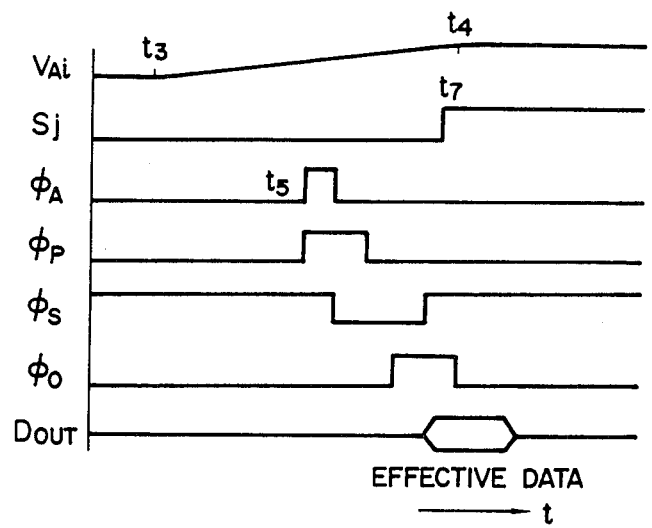
FIG. 7 is a timing chart showing the relationships among the internal control signals of the static memory device when the address input signal changes very slowly.

In response to the output from the address buffer circuit Ai* or $\overline{Ai}$*, the output Sj of the decoder 3 is enabled or activated at the time t7. Therefore, as shown in FIG. 7, STDC output $\phi_A$ has already fallen to a low level at this time, the bit line precharge signal $\phi_p$, the bitline sense control signal $\phi_s$ and the output-buffer control signal $\phi_o$ which are subsequently generated by the output Sj do not operate for their expected functions yet or have already completed them. As a result, an erratic operation occurs. That is, the data in a previously selected memory cell by the old address instead of the newly selected memory cell may be read out or the old data remained on a bit line are stored into a newly selected memory cell.

As described above, when the address input signal changes very slowly, it results in the memory cell selection signal being generated much later than STDC output $\phi_A$ and the internal control signals such as $\phi_p$, $\phi_s$ and $\phi_o$ which are subsequently generated by the output $\phi_A$ to change the levels at which the inverters in the address buffer circuit transfer their states in order to avoid multi-access, That is, the correct time relationship among these signals cannot be maintained so that erratic operations result.

Next referring to FIGS. 8 through 27, the preferred embodiments of the present invention will be described. In a RAM with STDC in accordance with the present invention, the operation of STDC can be maintained in a predetermined relationship with the operations of each functional circuit in RAM so that not only the stable operation can be ensured but also the speeding-up of the READ operations beginning with precharging in response to the output of STDC can be attained.

According to one aspect of the present invention, only in response to the output of an address buffer, STDC is activated so that only after the output of the address buffer has completed its voltage level for activating certain memory cells, STDC starts the operation. According to another aspect of the present invention, in order to attain a high-speed operation by the earlier activation of STDC, in response not only to the address buffer output but also to the signal in the address buffer preceding the address buffer output, the operation of STDC is activated.

The preferred embodiments according to the first aspect of the present invention will be described.

Figure 8:
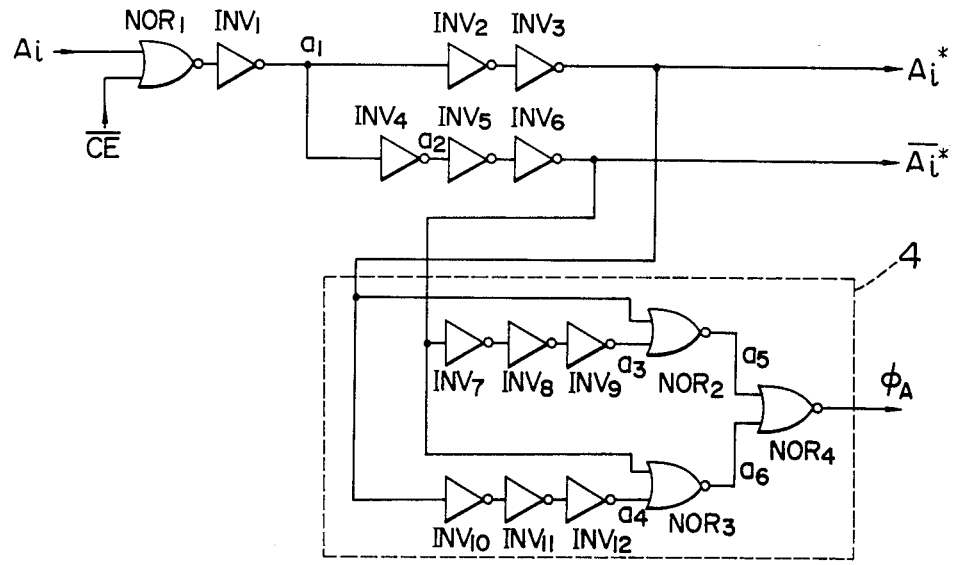
FIG. 8 shows a first embodiment of STDC in accordance with the present invention comprising inverter trains and NOR gates.

FIG. 8 shows an embodiment of the present invention which is different from the prior art device as shown in FIG. 2 in that instead of the voltage signals at the nodes a1 and a2 of the address buffer circuit 2 being given to STDC as input signals, Ai* and $\overline{Ai}$* which appear at the output nodes, respectively, of inverters $INV_3$ and $INV_5$ are input to STDC.

The operation of the embodiment as shown in FIG. 8 will be described with reference to FIGS. 9 and 10. FIG. 9 is the timing chart when the input address signal Ai varies rapidly. In response to the change in the input address signal Ai, the voltage $V_{a1}$ at the node a1 varies, and a first address buffer output Ai* is derived through inverters $INV_2$ and $INV_3$ while a second output $\overline{Ai}$* is derived through an inverter train consisting of $INV_4$, $INV_5$ and $INV_6$. These two outputs are input to STDC. In response to the rise of $V_{Ai}$, the voltage $V_{Ai*}$ rises so that the voltage $V_{a5}$ at the node a5 falls. After a predetermined time delay due to an inverter train $INV_{10}$, $INV_{11}$ and $INV_{12}$, the voltage $V_{a4}$ at the node a4 falls. Therefore the voltage $V_{a6}$ at the node a6 rises. When and only when both the voltages at the nodes a5 and a6 are low, the output $\phi_A$ of STDC rises to a high level. In like manner, in response to the fall of $V_{Ai}$, the voltage $V_{Ai*}$ rises so that the voltage $V_{a6}$ at the node a6 falls and the voltage $V_{a5}$ at the node a5 rises after a predetermined time delay. Therefore, when and only when both the voltages at the nodes a5 and a6 are low, the output $\phi_A$ of STDC keeps a high level.

FIG. 10 is the timing chart when the address input signal Ai varies very slowly. It is seen that the voltage $V_{a1}$ at the node a1 also varies very slowly. The inverters $INV_2$ through $INV_6$ are so designed and constructed that the second address-buffer output $V_{\overline{Ai}*}$ first falls and then $V_{Ai*}$ rises and vice versa, whereby multi-access may be prevented.

In response to the fall of $V_{Ai*}$, the voltage $V_{a3}$ at the node rises while the voltage $V_{a5}$ at the node a5 falls. In response to the rise of $V_{Ai*}$, the voltage $V_{a4}$ at the node a4 falls while the voltage $V_{a6}$ at the node a6 rises. Therefore, the output $\phi_A$ of STDC; that is, the output of NOR gate $NOR_4$ rises to a high level when and only when both the voltages $V_{a5}$ and $V_{a6}$ respectively at the nodes a5 and a6 are low. When the address input signal Ai falls slowly, in response to the fall of $V_{Ai*}$, the voltage $V_{a6}$ at the node a6 falls and in response to the rise of $V_{Ai*}$, the voltage $V_{a5}$ at the node a5 rises. Therefore, the output $\phi_A$ of STDC becomes high when and only when both the voltages at the nodes a5 and a6 are low. As a result, in response to the transition of the address input signal, the STDC output $\phi_A$ becomes a one-shot pulse with a predetermined pulse duration. Moreover, it is ensured that this pulse lasts even after either of the output Ai* or $\overline{Ai}$* has risen to a high level so as to activate the decoder.

Figure 11:
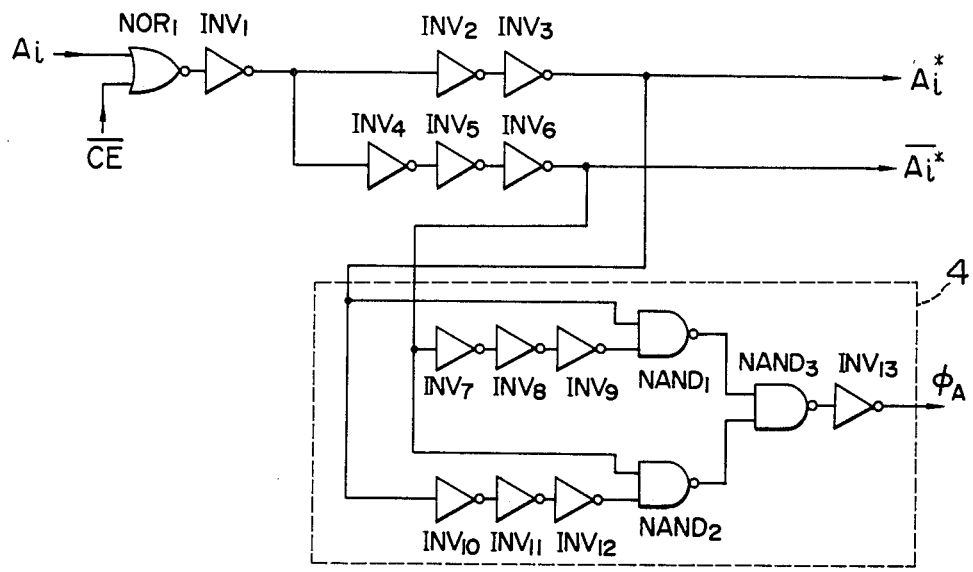
FIG. 11 shows a second embodiment of the present invention comprising inverter trains and NAND gates.

In FIG. 11 is shown a second embodiment which is substantially similar in construction to the embodiment as shown in FIG. 8 except that instead of the NOR gates $NOR_2$ and $NOR_3$, NAND gates $NAND_1$ and $NAND_2$ are used, and that instead of the NOR gate $NOR_4$, series-connected NAND gate $NAND_3$ and inverter $INV_{13}$ are used. Thus, the second embodiment accomplishes the operation with the NAND operation instead of NOR operation as seen in FIG. 8.

Figure 12:
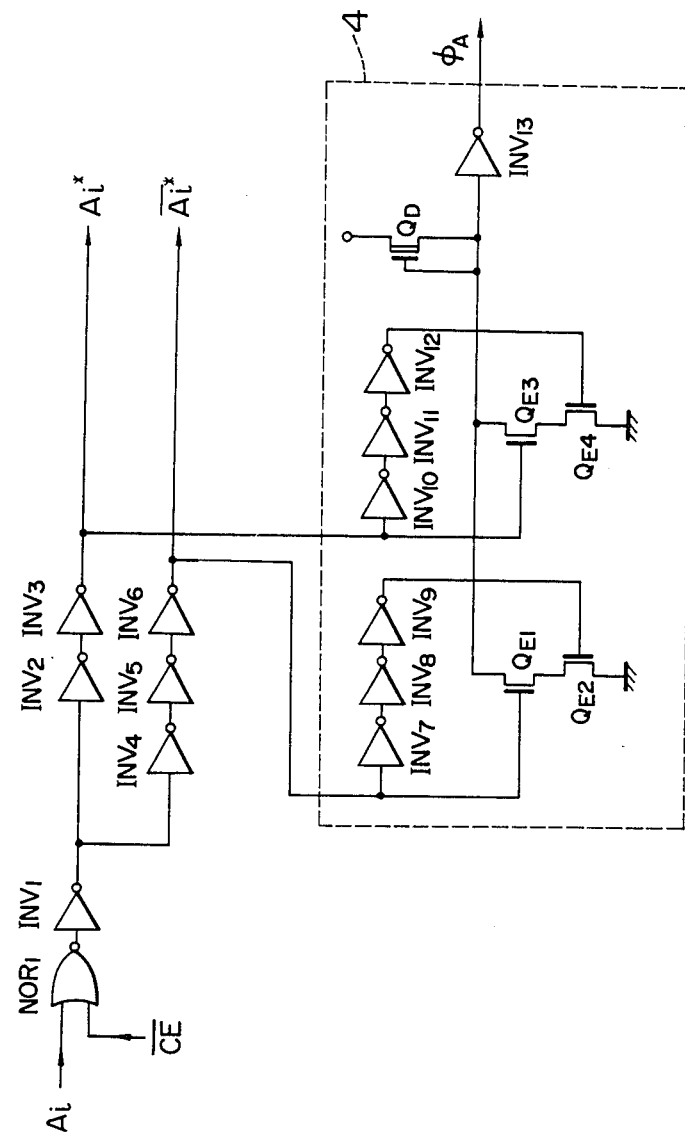
FIG. 12 shows a third embodiment of the present invention which is substantially similar in construction to the second embodiment as shown in FIG. 11 except that E/D type transistor logic gates are used.

In FIG. 12 is shown a third embodiment of the present invention in which a load transistor $Q_D$ is a depletion type MOS transistor and the output node of a NAND gate consisting of series-connected enhancement type MOS transistors $Q_{E1}$ and $Q_{E2}$ and that of a NAND gate consisting of series-connected enhancement mode MOS transistors $Q_{E3}$ and $Q_{E4}$ are connected in parallel to each other and connected to an inverter $INV_{13}$. The transistor $Q_{E1}$ receives Ai*; the transistor $Q_{E2}$ receives $\overline{Ai}$* which is delayed through the inverter train $INV_7$, $INV_8$ and $INV_9$; the transistor $Q_{E3}$ receives Ai* and the transistor $Q_{E4}$ receives Ai* which is delayed through an inverter train $INV_{10}$, $INV_{11}$ and $INV_{12}$. The features of the third embodiment reside in the fact that as compared with the second embodiment as shown in FIG. 11, one NAND gate can be eliminated and the fact that the pulse duration of the STDC output $\phi_A$ can be varied not only by changing the characteristics of the inverters $INV_7$ through $INV_{12}$ but also by varying the conductance of the load transistor $Q_D$.

Figure 13:
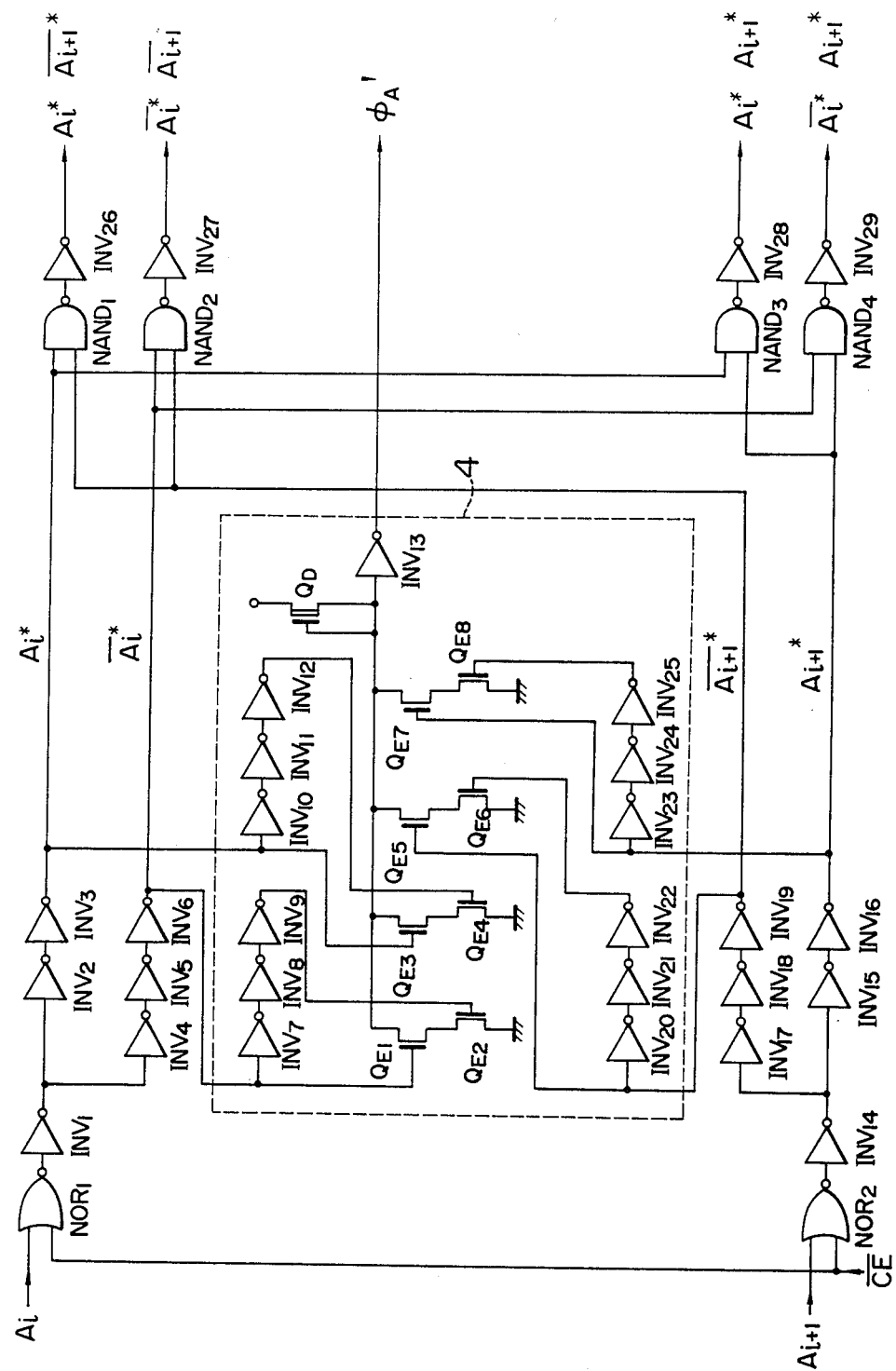
FIG. 13 shows a fourth embodiment of the present invention in which two sets of the circuits as shown in FIG. 12 are used to receive two sets of address input signals.

A fourth embodiment as shown in FIG. 13 consists of a combination of two circuits as shown in FIG. 12. Four NAND gates $NAND_1$ through $NAND_4$ and inverters $INV_{26}$ through $INV_{29}$ are employed so that in response to two pairs of address-buffer outputs Ai* and $\overline{Ai}$*: Ai+1* and $\overline{Ai+1}$*, four logic products Ai* $\overline{Ai+1}$*; Ai* Ai+1*; $\overline{Ai}$*. Ai+1*; and $\overline{Ai}$*. Ai+1* are produced for the decoder input signals.

Figure 14A:
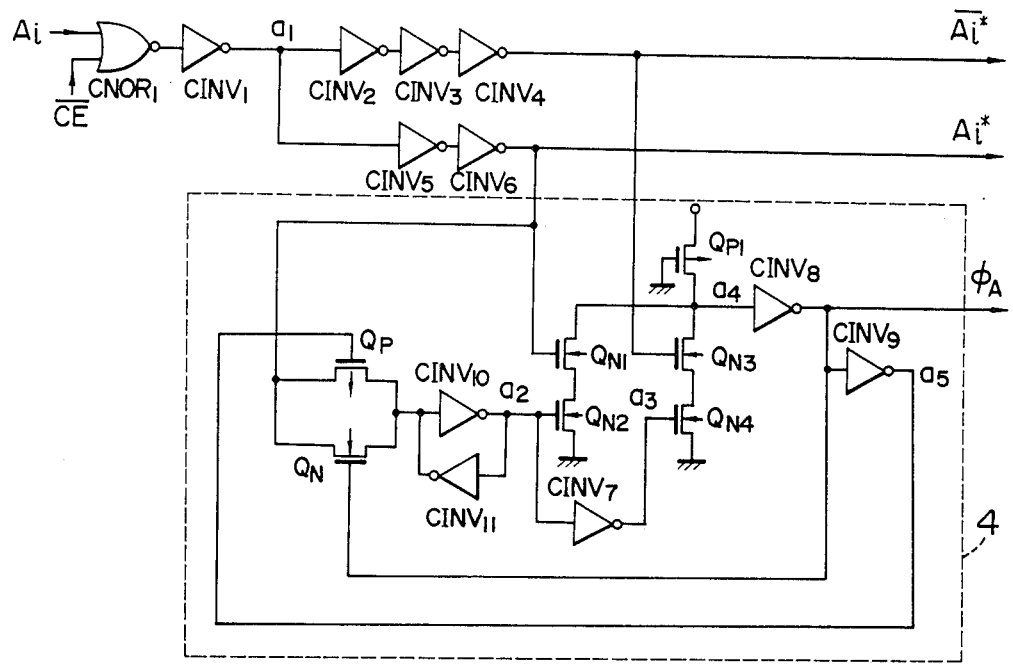
FIGS. 14(a), (b) and (c) show a fifth, a sixth and a seventh embodiment, respectively, of the present invention in which a flip-flop is used instead of an inverter train providing a time delay.

In FIG. 14(a) is shown a fifth embodiment of the present invention in which instead of utilizing a time delay provided by the inverter trains, the preceding address signal stored in a flip-flop consisting of complementary MOS inverters $CINV_{10}$ and $CINV_{11}$ is used to derive the output from STDC. The whole circuitry is of the C-MOS construction.

Figure 14B:
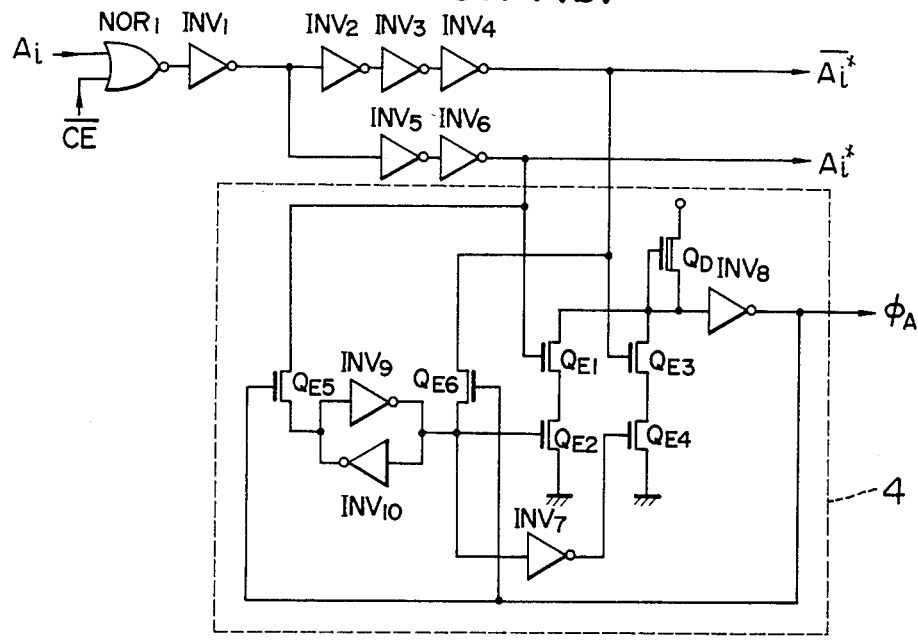

In FIG. 14(b) is shown a sixth embodiment of the present invention, whose circuitry operation is substantially similar to that of the fifth embodiment as shown in FIG. 14(a) except that E/D construction is used instead of the complementary MOS construction. In order to facilitate writing data into the flip-flop, driving transistors $Q_{E5}$ and $Q_{E6}$ are connected to the input and output, respectively, of the flip-flop and the outputs from the address buffer circuit are applied to the gates of $Q_{E5}$ and $Q_{E6}$.

Figure 14C:
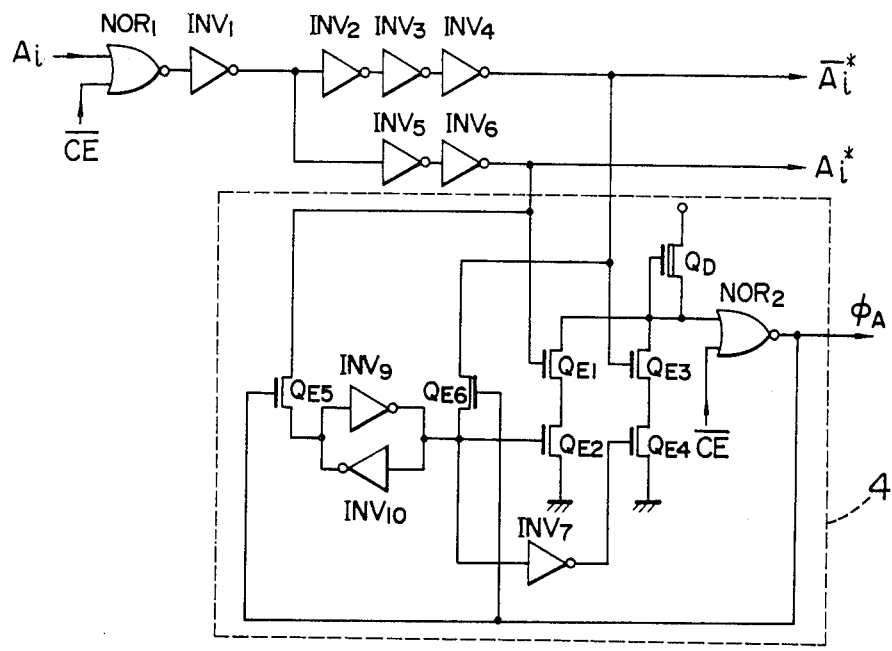

In FIG. 14(c) is shown a seventh embodiment of the present invention the mode of operation of which is substantially similar to that of the sixth embodiment as shown in FIG. 14(b). Instead of the inverter $INV_8$ of FIG. 14(b), a NOR gate $NOR_2$ is used which receives $\overline{CE}$ as one input. Therefore, when the $\overline{CE}$ signal is high; that is, when the chip including STDC is nonselected, the output $\phi_A$ becomes high so that the circuit will not be enabled at all.

Figure 15:
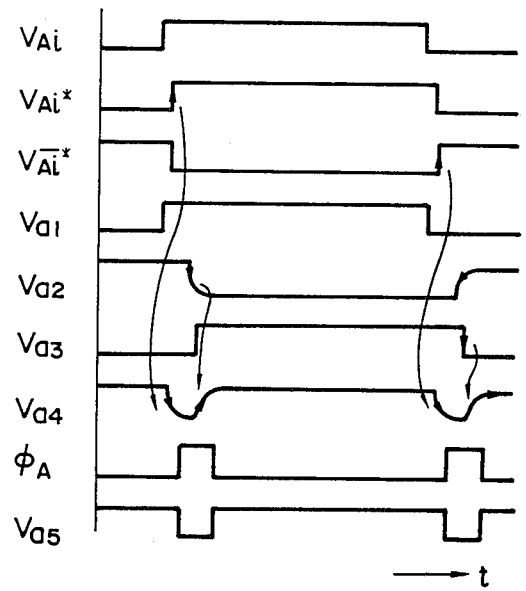
FIG. 15 is a timing chart used to explain the operation of the fifth embodiment as shown in FIG. 14(a)

The operation of the fifth embodiment as shown in FIG. 14(a) is best understood with reference to FIG. 15. When the address input signal $V_{Ai}$ rises and the address buffer output $V_{Ai*}$ rises from a low level to a high level, both N-channel MOS transistors $Q_{N1}$ and $Q_{N2}$ are ON so that, since the P-channel MOS transistor $Q_{P1}$ is always kept ON, it takes time in some extent before the voltage $V_{a4}$ at the node a4 approaches to the ground potential, but it does not equal to the ground potential. As a result, the output $\phi_A$ of STDC; that is, the output from the inverter $CINV_8$ becomes high. The output $\phi_A$ is applied to the gate of an input-transfer N-channel MOS transistor $Q_N$. The output $\phi_A$ is inverted by an inverter $CINV_9$ and the voltage signal $V_{a5}$ at the node a5 is applied to the gate of an input-transfer P-channel MOS transistor $Q_P$ of STDC. As a result, the transistors $Q_N$ and $Q_P$ can transfer the signal only when the output $\phi_A$ of STDC is at a high level. Consequently, the address buffer output Ai* reverses the flip-flop consisting of the inverters $CINV_{10}$ and $CINV_{11}$ so that the voltage $V_{a2}$ at the node a2 falls and an N-channel MOS transistor $Q_{N2}$ is OFF. Therefore, the load transistor $Q_{P1}$ raises the voltage $V_{a4}$ at the node a4 so that the output $\phi_A$ falls. The transfer gate consisting of the transistors $Q_N$ and $Q_P$ is consequently OFF. In this case, the flip-flop consisting of the C-MOS inverters $CINV_{10}$ and $CINV_{11}$ stores a potential information of the address after the Ai address signal has changed.

When the address input signal $V_{Ai}$ falls, the address buffer output $V_{\overline{Ai}*}$ rises so that a transistor $Q_{N3}$ is ON. As a result, the flip-flop is reversed so that the voltage $V_{a3}$ at the node a3 falls and consequently a transistor $Q_{N4}$ is disabled. In this manner, the STDC output $\phi_A$ is derived.

In the embodiments as shown in FIGS. 11, 12, 13 and 14(a), the inverter $INV_{13}$ or $CINV_8$ is used as the output stage of STDC, but as shown in FIG. 14(c) a two-input NOR gate whose one input and output are connected in the manner described and whose the other input is connected to the signal $\overline{CE}$ may be employed so that when the chip is not selected, the output pulse $\phi_A$ will keep low level. Thus, the erratic operation, in which when the chip is not selected, STDC is enabled in response to the noise from a power supply so that the internal circuit is enabled and consequently the information in a memory cell is destroyed, can be prevented.

Next the preferred embodiments of the present invention based on another aspect thereof will be described.

Figure 16:
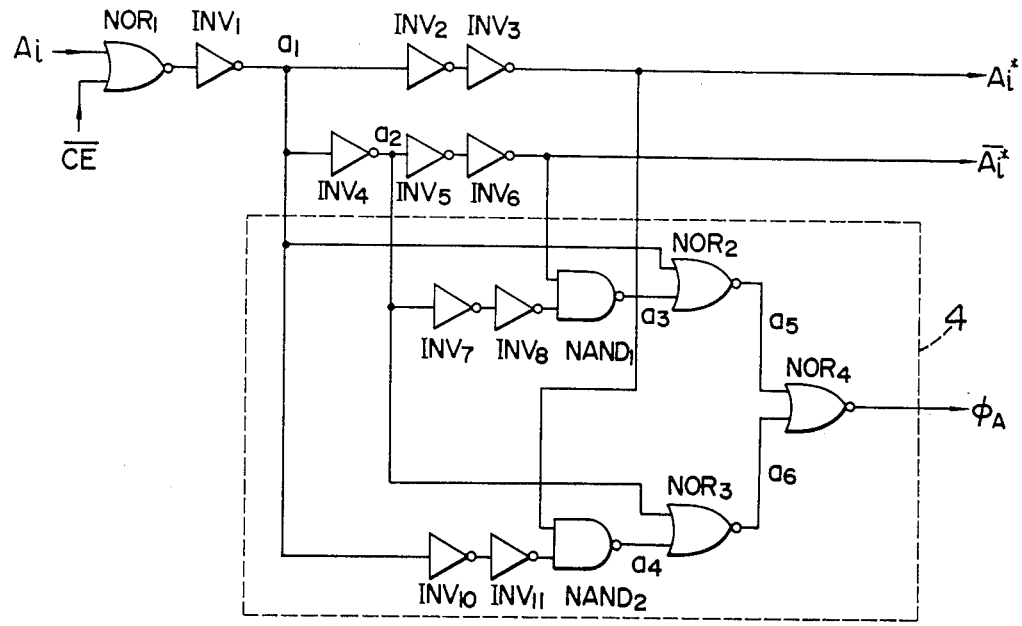
FIG. 16 shows an eighth embodiment of the present invention comprising an address buffer, inverters and logic gates.

In FIG. 16 is shown an eigth embodiment of the present invention which is different from the prior art as shown in FIG. 2 in that instead of the inverters $INV_9$ and $INV_{12}$, NAND gates $NAND_1$ and $NAND_2$ are used. One input of the NAND gate $NAND_1$ is connected to the output node of the inverter $INV_6$ while one input of the NAND gate $NAND_2$, to the output node of the inverter $INV_3$.

Figure 17:
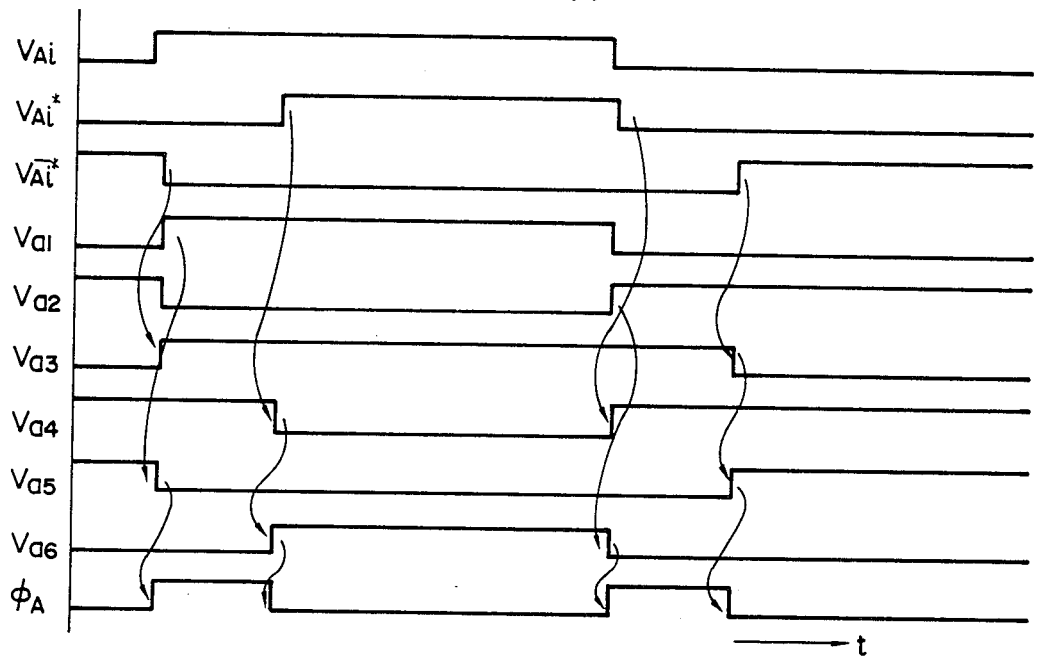
FIG. 17 is a timing chart used to explain the operation thereof.

The operation of the eight embodiment may be well understood with reference to FIG. 17. As the address input Ai rises from a low level to a high level, the voltage $V_{a1}$ at the node a1 also rises from a low level to a high level so that the voltage $V_{a5}$ at the node a5 falls from a high level to a low level. As a result, the STDC output $\phi_A$ becomes high. The address buffer output Ai* rises from a low level to a high level after the other address buffer output $\overline{Ai}$* has fallen so that the multi-access by the decoder can be prevented. Then, the voltage $V_{a4}$ at the node a4; that is, the output of the NAND gate $NAND_2$ falls from a high level to a low level so that the voltage $V_{a6}$ at the node a6 rises from a low level to a high level and consequently the output $\phi_A$ falls again from a high level to a low level. On the other hand, when the address input Ai falls from a high level to a low level, the voltage $V_{a2}$ at the node a2 rises from a low level to a high level so that the voltage $V_{a6}$ at the node a6 falls from a high level to a low level and consequently the output $\phi_A$ rises from a low level to a high level.

When the decoder is enabled or activated in response to a high level signal as shown in FIG. 2(b), the one address buffer output $\overline{Ai}^*$ rises from a low level to a high level after the other address buffer output $Ai^*$ has fallen to a low level. Therefore, the voltage at the node a3 falls from a high level to a low level and the voltage at the node a5 rises from a low level to a high level so that the output $\phi_A$ falls again from a high level to a low level. As a result, in response to the transition in address input signal, the STDC output $\phi_A$ becomes a one-shot pulse with a predetermined pulse width. This pulse will not disappear before either of the address buffer output $Ai^*$ or $\overline{Ai}^*$ becomes high so as to enable the decoder.

Figure 18:
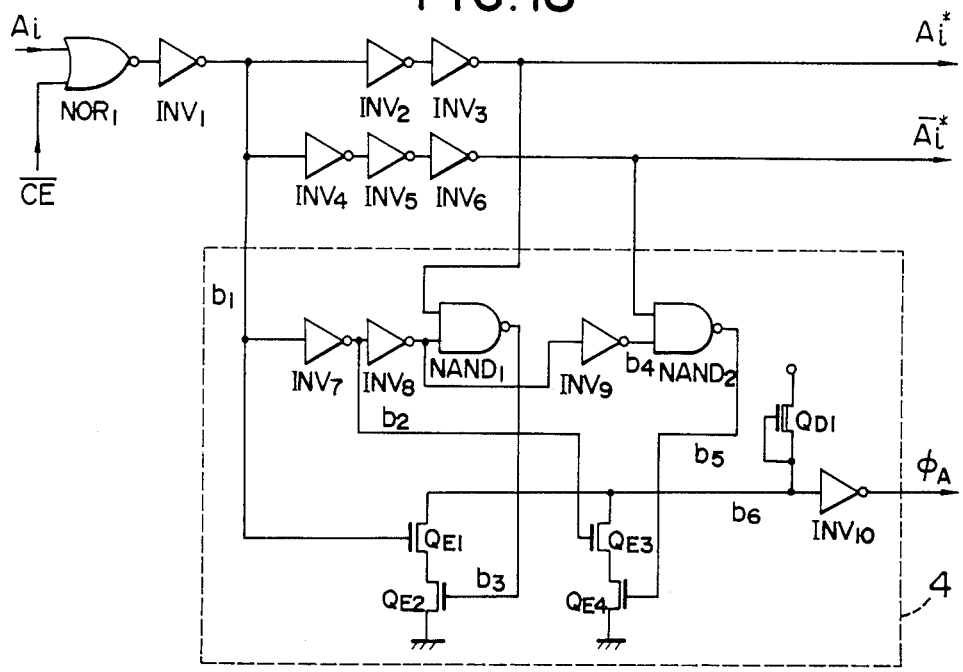
FIG. 18 shows a ninth embodiment of the present invention.

In FIG. 18 is shown a ninth embodiment of the present invention comprising STDC which in turn comprises a train of three inverters $INV_7$, $INV_8$ and $INV_9$; NAND gates $NAND_1$ and $NAND_2$, two parallel-connected NAND gates consisting of enhancement type MOS driving transistors $Q_{E1}$ through $Q_{E4}$ and a depletion type MOS load transistor $Q_{D1}$; and an inverter $INV_{10}$. The output of the inverter $INV_1$ is applied through the inverters $INV_7$ and $INV_8$ to one input of the NAND gate $NAND_1$ while the output $Ai^*$ of the inverter $INV_3$ is applied to the other input thereof. The output of the inverter $INV_1$ is applied through the three inverters $INV_7$, $INV_8$ and $INV_9$ to one input of the NAND gate $NAND_2$ while the output $\overline{Ai}^*$ of the inverter $INV_6$ is applied to the other input thereof. The output b3 of the NAND gate $NAND_1$ and the output b1 from the inverter $INV_1$ are applied to a drive circuit of the NAND gate consisting of the MOS transistors $Q_{E1}$ and $Q_{E2}$. The output b5 of the NAND gate $NAND_2$ and the output b2 of the inverter $INV_7$ are applied to the drive circuit of the NAND gate consisting of the MOS transistors $Q_{E3}$ and $Q_{E4}$. The output node b6 of the two parallel-connected NAND gates consisting of these MOS transistors and the MOS load transistors $D_{D1}$ is connected to the inverter $INV_{10}$. The output of the inverter $INV_{10}$ is the output $\phi_A$ of STDC.

Figure 19:
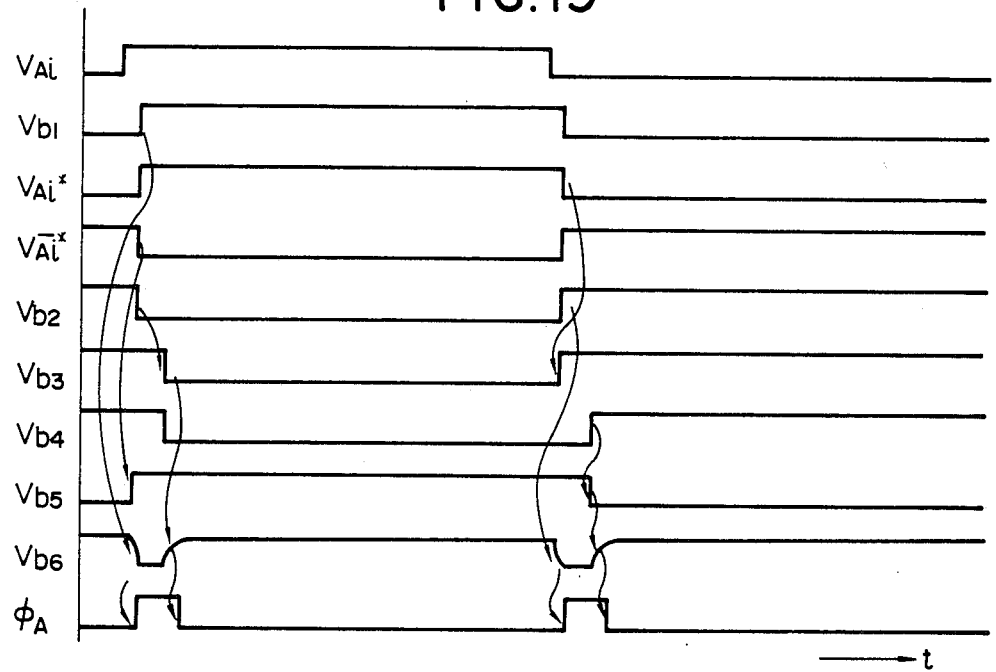
FIG. 19 is a timing chart used to explain the operation thereof when the address input signal changes rapidly.
Figure 20:
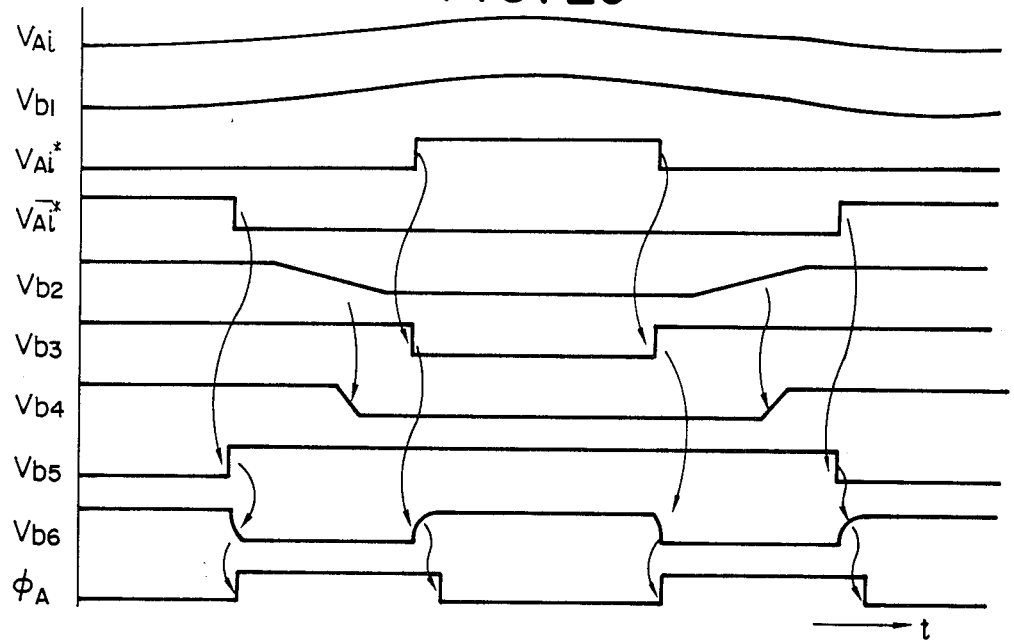
FIG. 20 is a timing chart used to explain the operation thereof when the address input signal changes very slowly.

The operation of the ninth embodiment will be understood with reference to FIGS. 19 and 20. FIG. 19 shows the timing chart in the rapid change of address input signal while FIG. 20 does that of slow change of the address input signal.

When the address input signal $V_{Ai}$ rises fast, the voltage $V_{b1}$ at the node b1 rises so that the MOS transistor $Q_{E1}$ is immediately driven into the conduction state and consequently the voltage $V_{b6}$ at the node b6 becomes low. As a result, the STDC output $\phi_A$ rises to a high level. Due to a time delay through two inverters $INV_7$ and $INV_8$, the output of the NAND gate $NAND_1$, that is, the voltage $V_{b3}$ at the node b3 falls to a low level after a predetermined time delay. The MOS transistor $Q_{E2}$ is disabled so that the voltage $V_{b6}$ at the node b6 rises to a high level after a predetermined time constant due to the charging ability of the load transistor $Q_{D1}$ and consequently the STDC output $\phi_A$ returns to a low level.

When the address input signal $V_{Ai}$ falls rapidly, the voltage $V_{b2}$ at the node b2 becomes high so that the MOS transistor $Q_{E3}$ is driven into the conduction state and consequently the voltage $V_{b6}$ at the node b6 becomes low, and then the STDC output $\phi_A$ becomes high. Due to a time delay caused by the two inverters $INV_8$ and $INV_9$, the output of the NAND gate $NAND_2$; that is, the voltage $V_{b5}$ at the node b5 becomes low after a predetermined time delay so that the MOS transistor $Q_{E4}$ is disabled and the load transistor $Q_{D1}$ raises the voltage $V_{b6}$ at the node b6. Thus the STDC output $\phi_A$ falls.

As described above, when the address input signal changes rapidly, the STDC output $\phi_A$ with a predetermined pulse duration can be obtained by suitable design of a time delay obtained through the inverters in STDC without the use of the address buffer outputs $Ai^*$ and $\overline{Ai}^*$.

When the decoder is enabled in response to a high level signal as shown in FIG. 2(b), the conductance of transistors which construct the inverters in the address buffer circuit are designed for the output voltages $V_{Ai^*}$ and $V_{\overline{Ai}^*}$ to change as shown in FIG. 5(a) so that the multi-access operation may be avoided. Therefore, when the address input signal $V_{Ai}$ becomes gradually high, the address buffer output $V_{\overline{Ai}^*}$ falls earlier than the output $V_{Ai^*}$ rises. In response to the fall of the output $V_{\overline{Ai}^*}$ the output $V_{b5}$ of the NAND gate $NAND_2$ rises while the voltage $V_{b2}$ at the node b2 has not yet fallen so that both the MOS transistors $Q_{E3}$ and $Q_{E4}$ are driven into the conduction state and consequently the voltage $V_{b6}$ at the node b6 becomes low, thus the STDC output $\phi_A$ rises to a high level. Meanwhile the voltage $V_{b2}$ at the node b2 falls, but the voltage $V_{b3}$ at the node b3 remains at a high level because the address buffer output $Ai^*$ has not risen yet. The voltage $V_{b1}$ at the node b1 is inbetween its high and low levels, but works as a high level with respect to the MOS transistor $Q_{E1}$ so that both the MOS transistors $Q_{E1}$ and $Q_{E2}$ are driven into the conduction state and consequently the voltage $V_{b6}$ at the node b6 remains at a low level, thus the STDC output $\phi_A$ remains at a high level. However, the address buffer output $V_{\overline{Ai}^*}$ becomes high after the other address buffer output $V_{\overline{Ai}^*}$ does low so that the output $V_{b3}$ of the gate $NAND_1$ falls. As a result, the MOS transistor $Q_{E3}$ is OFF and the load transistor $Q_{D1}$ raises the voltage $V_{b6}$ at the node b6.

When the address input signal falls gradually, in response to the rise of the voltage $V_{b3}$ at the node b3 caused by the fall of the output $Ai^*$ level, the STDC output $\phi_A$ becomes high. Thereafter the voltage at the note b1 gradually falls so that the voltages at the nodes b2 and b5 become high and consequently the output $\phi_A$ remains at a high level for some time duration. Next in response to the rise of the buffer output $V_{\overline{Ai}^*}$, the voltage $V_{b5}$ at the node b5 falls so that the load transistor $Q_{D1}$ raises the voltage $V_{b6}$ at the node b6, whereby the STDC output $\phi_A$ returns to a low level.

Thus, the STDC output $\phi_A$ does not become low before the address buffer output, either $V_{Ai^*}$ or $V_{\overline{Ai}^*}$, rises.

Figure 21A:
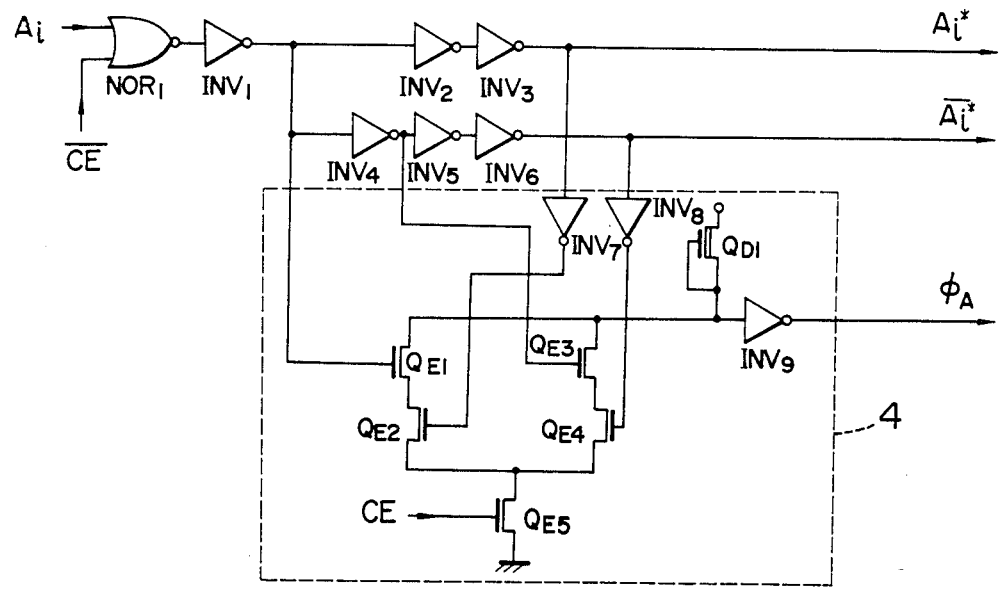
FIGS. 21(a), 21(b), 22 and 24 show a tenth, an eleventh, a twelfth and a thirteenth embodiment, respectively, of the present invention in which a NAND gate is used as a logic gate for deriving the output signal from STDC.

In FIG. 21(a) is shown a tenth embodiment of the present invention. The STDC has no inverter trains for adjusting the time delay, while the inverter trains in the address buffer circuit is utilized for this purpose. Two NAND gates consisting of enhancement type MOS driving transistors $Q_{E1}$, $Q_{E2}$, $Q_{E3}$ and $Q_{E4}$ and a load transistor $Q_{D1}$ are connected in common to an enhancement mode MOS transistor $Q_{E5}$, the gate of which is applied with the chip selection signal CE. The tenth embodiment has the features that the number of inverters used may be lessened and that when the chip selection signal CE becomes low, STDC cannot be activated.

Alternatively, the transistor $Q_{E5}$ may be eliminated and the transistors $Q_{E2}$ and $Q_{E4}$ may be directly connected to $V_{ss}$ power supply so that STDC may be normally enabled regardless of the state of the chip selection signal CE.

Figure 21B:
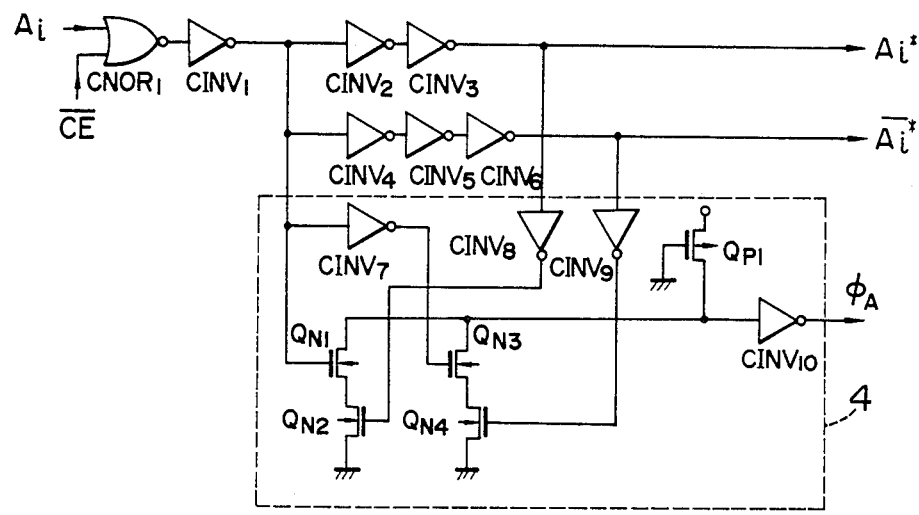

In FIG. 21(b) is shown an eleventh embodiment of the present invention which is substantially similar in construction to the tenth embodiment as shown in FIG. 21(a) except that the eleventh embodiment of the C-MOS type and the transistor $Q_{E5}$ is eliminated whereby STDC is not controlled by the chip selection signal CE. In the tenth embodiment as shown in FIG. 21(a), the output of the inverter $INV_4$ which is opposite to the logical state of the signal applied to the gate of the transistor $Q_{E1}$ is applied to the gate of the transistor $Q_{E3}$, but in the eleventh embodiment, the output from an inverter $CINV_7$ to which is applied the output of the inverter $CINV_1$ in the address buffer circuit is applied to the gate of the transistor $Q_{N3}$. The inverter $CINV_7$ is included in STDC. Since in addition to the inverter $CINV_4$ the inverter $CINV_7$ is provided for the time delay element, a time delay provided by the inverter $CINV_4$ may be arbitrarily designed so that the rise of the address buffer output $\overline{Ai}*$ may be delayed without concerning the STDC operation. On the other hand, the inverter $CINV_7$ can be designed to have almost no time delay.

Figure 22:
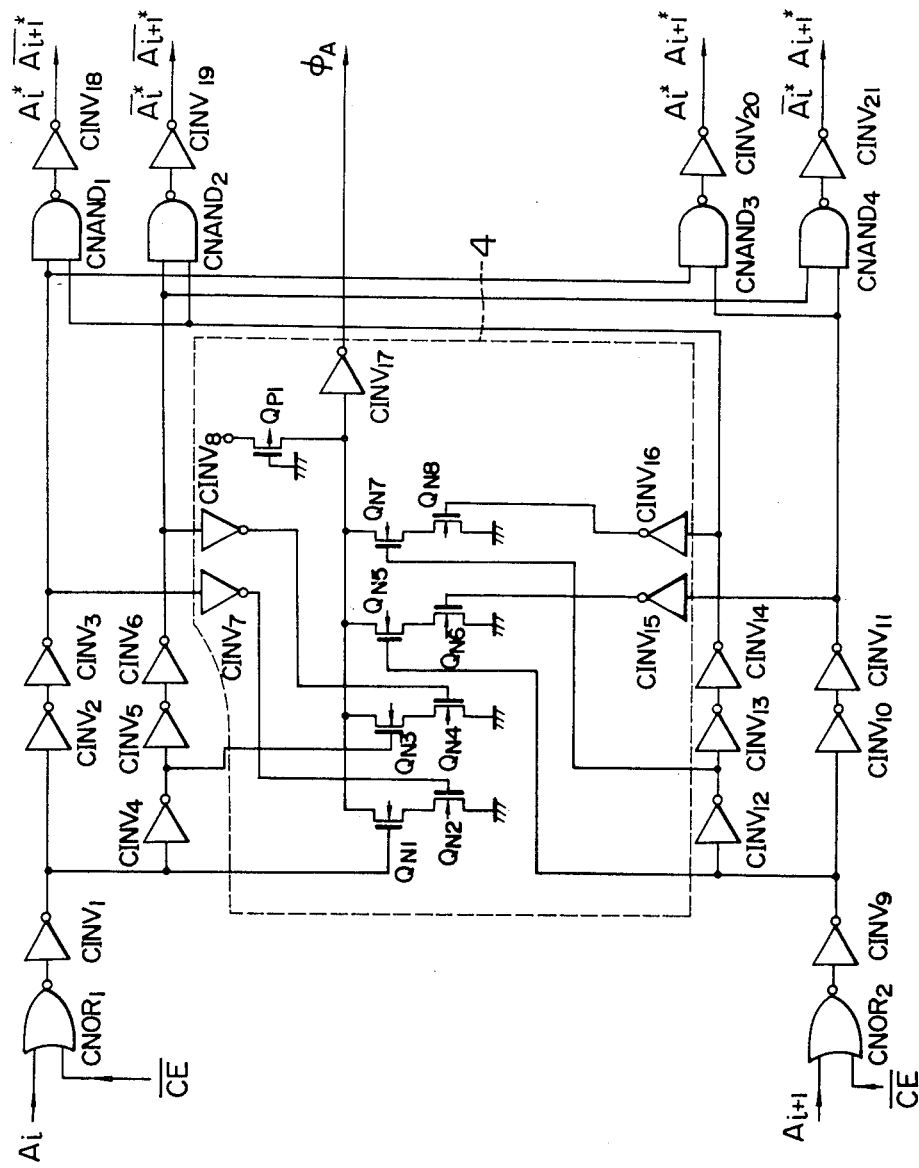
Figure 23:
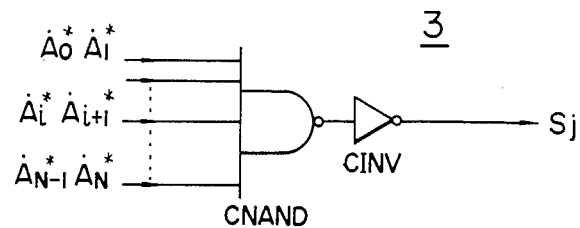
FIG. 23 shows a decoder which is used in conjunction with the twelfth embodiment as shown in FIG. 22.

In FIG. 22 is shown a twelfth embodiment of the present invention which is fundamentally similar in input system to the tenth embodiment as shown in FIG. 21(a). That is, two sets of STDC which are not controlled by the chip selection signal CE are used, and the twelfth embodiment is of the C-MOS type, that is, C-MOS NOR gates $CNOR_1$ and $CNOR_2$ and C-MOS inverters $CINV_1$ through $CINV_{17}$. Furthermore the twelfth embodiment uses C-MOS NAND gates $CNAND_1$ through $CNAND_4$ and C-MOS inverters $CINV_{18}$ through $CINV_{21}$ so that in response to two pairs of address buffer outputs $Ai*$ and $\overline{Ai}*$; and $Ai+1*$ and $\overline{Ai+1}*$, four logical products $Ai*.\overline{Ai+1}*$; $\overline{Ai}*.\overline{Ai+1}*$; $Ai*.Ai+1*$ and $\overline{Ai}*.Ai+1*$ are produced. For these four logical products, the decoder as shown in FIG. 23 receives one of the four logical products as one input signal.

Figure 24:
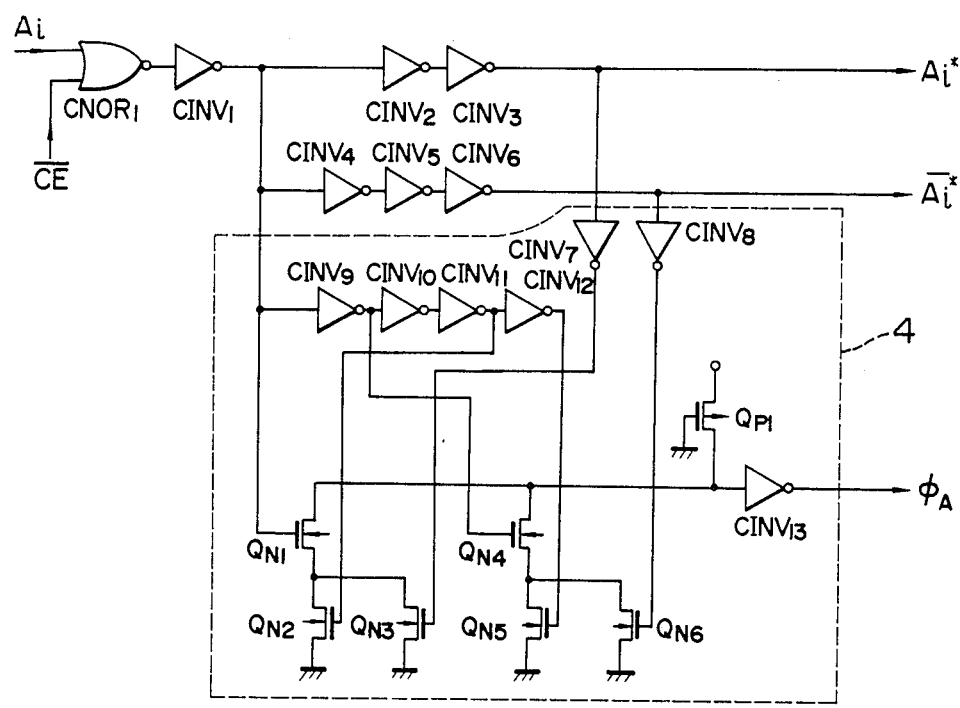

In FIG. 24 is shown a thirteenth embodiment of the present invention. STDC receives as input signals the input and output signal of the first three inverters of a four C-MOS inverter trains $CINV_9$ through $CINV_{12}$, the reverse logic input and output signal of the last three inverters thereof and the reverse logic signals of the address buffer outputs $Ai*$ and $\overline{Ai}*$ through the C-MOS inverters $CINV_7$ and $CINV_8$, respectively. [STDC includes an inverter train consisting of $CINV_9$ through $CINV_{12}$ and inverters $CINV_7$ and $CINV_8$ to which are applied the address buffer outputs $Ai*$ and $\overline{Ai}*$, respectively. The output from the inverter $CINV_1$ of the address buffer circuit is applied to the inverter $CINV_9$ and the gate of the transistor $Q_{N1}$; the output from the inverter $CINV_9$ is applied to the gate of the transistor $Q_{N4}$; the output from the inverter $CINV_{11}$ is applied to the gate of the transistor $Q_{N2}$; the output of the last inverter $CINV_{12}$ is applied to the gate of the transistor $Q_{N5}$; the output from the inverter $CINV_7$ is applied to the gate of the transistor $Q_{N3}$; and the output from the inverter $CINV_8$ is applied to the gate of the transistor $Q_{N6}$.] According to the thirteenth embodiment, until the address buffer output $Ai*$ or $\overline{Ai}*$ has completely risen to a high level in response to the address input Ai, the input to a C-MOS inverter $CINV_{13}$ is maintained at a low level through N-channel MOS transistors $Q_{N1}$ and $Q_{N3}$ or $Q_{N4}$ and $Q_{N6}$ so that the STDC output $\phi_A$ may be maintained at a high level. Therefore, the normal operation may be ensured even for the slow change in the address input. On the other hand, when the address input changes rapidly, the STDC output $\phi_A$ with a pulse width which is dependent upon a time delay produced by the inverter train $CINV_9$ through $CINV_{12}$ is produced.

Figure 25:
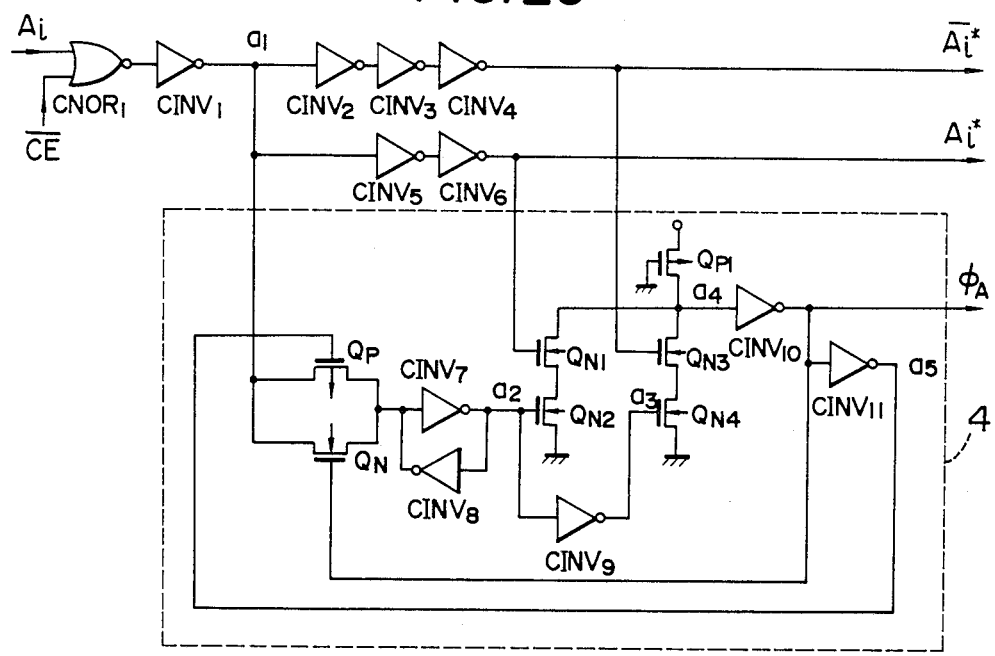
FIGS. 25, 26 and 27 show a fourteenth, a fifteenth and a sixteenth embodiment, respectively, of the present invention in which a flip-flop is used as a time-delay circuit and NAND gates are used to derive the output from STDC.

In FIG. 25 is shown a fourteenth embodiment of the present invention. STDC generates the output in response to the past address signal information stored in a flip-flop consisting of complementary inverters $CINV_7$ and $CINV_8$ instead of utilizing a time delay provided by an inverter train.

Figure 26:
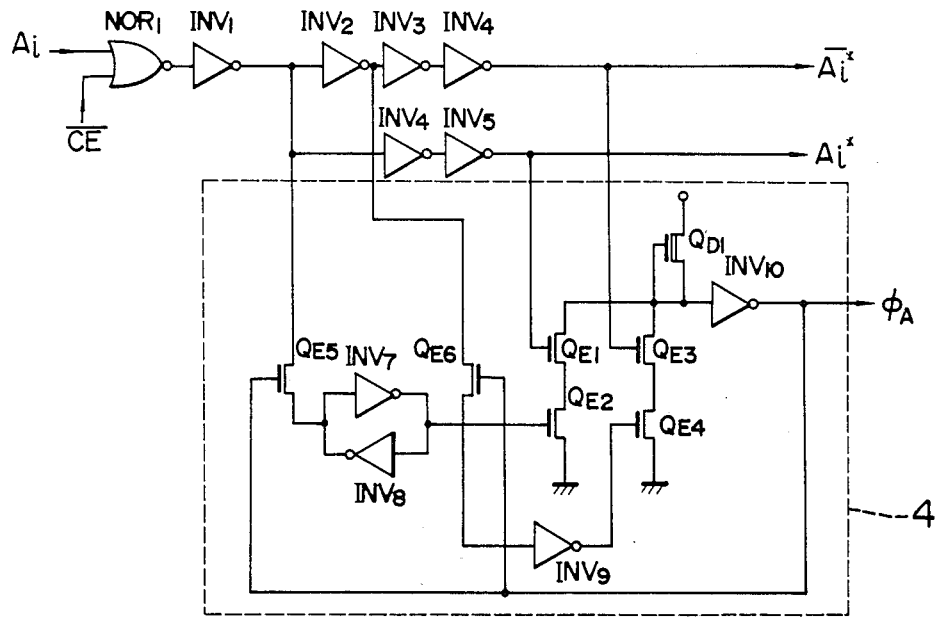
Figure 27:
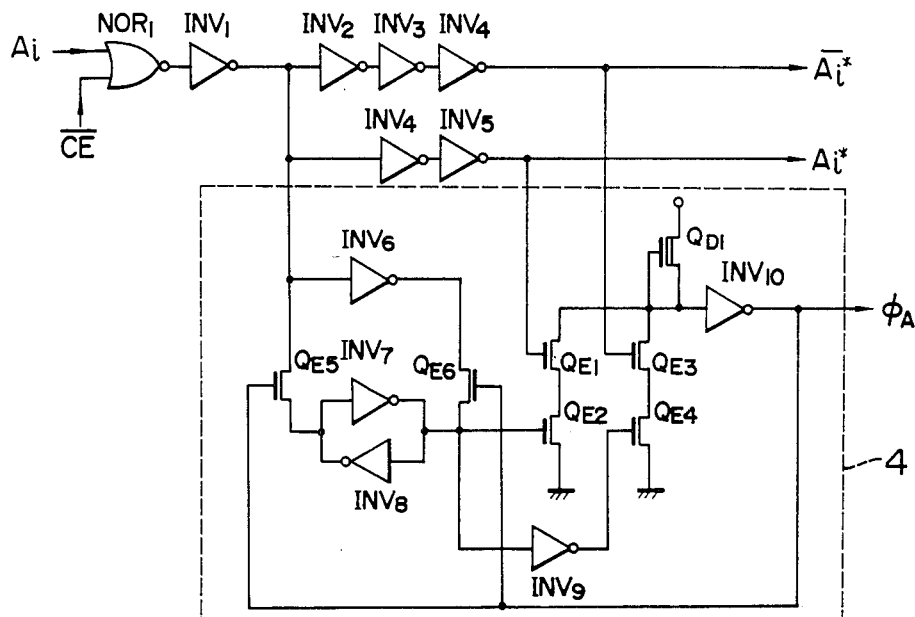

In FIGS. 26 and 27 are shown a fifteenth embodiment and a sixteenth embodiment of the present invention, respectively, which are substantially same in construction as the fourteenth embodiment as shown in FIG. 25 except that the fifteenth and sixteenth embodiments are of E/D type while the fourteenth embodiment is of the complementary type. In order to facilitate the data writing into the flip-flop, the driving transistors $Q_{E5}$ and $Q_{E6}$ are further added to both the input and output of the flip-flop and the opposite logical state signals are applied to the flip-flop.

The fifteenth embodiment as shown in FIG. 26 and the sixteenth embodiment as shown in FIG. 27 are different in that while in the fifteenth embodiment the output from the inverter $INV_2$ in the address buffer circuit as the reversed logic signal of the output of the inverter $INV_1$ is applied to the drain of the transistor $Q_{E6}$, in the sixteenth embodiment, the output of the inverter $INV_1$ of the address buffer circuit is inverted through an inverter $INV_6$ for the drain input of the transistor $Q_{E6}$.

In FIG. 27, when an address buffer signal is stored into the flip-flop, the inverter $INV_6$ can independently increase the driving ability so that the speed with which data is stored into the flip-flop can be increased.

In the embodiments as shown in FIGS. 18, 21(a), 21(b), 22, 24, 25, 26 and 27, the output stage of STDC is of an inverter $INV_{10}$, $INV_9$, $CINV_{10}$, $CINV_{17}$, $CINV_{13}$, $CINV_{10}$, $INV_{10}$ or $INV_{10}$ respectively but it should be noted that in order to keep the output pulse $\phi_A$ in a low level when the chip is not selected, a two-input NOR gate may be used in such a way that one input and the output are connected in the same manner as described above with reference to the above-mentioned inverters while the other input is connected to the signal $\overline{CE}$. Therefore, erratic operations caused by the data destroy in memory cells may be prevented even when STDC is activated in response to the noise from a power supply when the chip is not selected.

In the above-described embodiments, various logic circuits are used, but it is to be understood that the present invention is not limited thereto and that any other circuit may be used, which can generate a pulse with a predetermined pulse width in response to the transition of the original signal of the address buffer circuit and the address buffer outputs generated from address input signals. It is also noted that instead of the MOS load transistor, a junction field-effect transistor (JFET) may be used.

According to the first present invention, the output signals from the address buffer circuit are applied as input signals to STDC. That is, in response to the output signals from the address buffer circuit, the output signal of STDC is generated. Therefore, even when the address signal changes very slowly, the STDC output does not go to the inactive state before the address buffer outputs applied to the decoder are set up. As a result, a predetermined time relationship between the selection signal for the memory cell through the decoder and the internal control signals generated by the output from STDC can be maintained so that the readout operation without erratic operation is ensured.

According to the second present invention, the output signal of the address buffer circuit and the original signal of the output thereof are applied as input signals to STDC. Therefore, the output signal from the address buffer circuit defines the termination of the output pulse from STDC so that a predetermined time relationship between the decoder output for selecting the memory cells generated by the output signals from the address buffer circuit and the internal control signals generated by the output signal from STDC may be maintained, whereby the readout operation without erratic operation can be ensured.

What is claimed is:

1. A memory device comprising:
    a signal generating circuit means for receiving a first signal and producing second and third signals in response to said first signal, said second and third signals being delayed relative to said first signal, said second signal having the same logic level as said first signal, and said third signal having an opposite logic level, said signal generating circuit means comprising:
    a first circuit having an input terminal and an output terminal and a second circuit having an input terminal and an output terminal, said input terminals being connected together, said first and second signals being received in said connected input terminals, each of said second and third signals being produced on at least one of said output terminals; and
    a detector means to which are applied at least said second and third signals, thereby detecting the transition of said first signal.

2. A memory device as set forth in claim 1 wherein said first signal is an address signal for said memory device, and said second and third signals are applied to a decoder means which selects a memory cell in said memory device.

3. A memory device as set forth in claim 1 wherein only said second and third signals are applied to said detector means.

4. A memory device as set forth in claim 1 wherein said first signal and a fourth signal which has an opposite logical relationship with said first signal are applied to said detector means.

5. A memory device as set forth in claim 4 wherein said fourth signal is produced by said signal generating circuit means.

6. A memory device as set forth in claim 4 wherein said fourth signal is generated by an independent circuit which is different from said signal generating circuit means and to which is applied said first signal.

7. A memory device as set forth in claim 1 wherein said signal generating circuit means includes an address buffer means, and said detector means includes a signal-transition detector circuit.

8. A memory device as set forth in claim 1 wherein said detector means comprises:
    a first logic gate to which are applied said second and third signals through an odd number of inverters;
    a second logic gate to which are applied said third and second signals through an odd number of inverters; and
    a third logic gate to which are applied the output signals derived from said first and second logic gates.

9. A memory device as set forth in claim 1 wherein said detector means comprises:
    a first pair of series-connected field-effect transistors one terminal of which is connected to a first power supply terminal, said second signal being applied to the gate of one of said series-connected field-effect transistors and a signal which is derived by said second signal through an odd number of inverters and which has the opposite logical relationship with said second signal being applied to the gate of the other of said series-connected field-effect transistors;
    a second pair of series-connected field-effect transistors one terminal of which is connected to said first power supply terminal, said third signal being applied to the gate of one of said second pair of series-connected field-effect transistors and a signal which is derived by said third signal through an odd number of inverters being applied to the gate of the other of said second pair of series-connected field-effect transistors;
    a load field-effect transistor interconnected between a second power supply terminal and the conjunction node of said first and second pairs of series-connected field-effect transistors; and
    a logic gate the input terminal of which is connected to said conjunction node of said first and second pairs of series-connected field-effect transistors.

10. A memory device as set forth in claim 1 wherein said detector means comprises:
    a flip-flop;
    a first pair of series-connected field-effect transistors one terminal of which is connected to a first power supply terminal, said second signal being applied to the gate of one of said series-connected field-effect transistors and the output from said flip-flop being applied to the gate of the other of said series-connected field-effect transistors;
    a second pair of series-connected field-effect transistors one terminal of which is connected to said first power supply terminal, said third signal being applied to the gate of one of said second pair of series-connected field-effect transistors and a signal which has the opposite logical relationship with the output from said flip-flop being applied to the gate of the other of said second pair of series-connected field-effect transistors;
    a load field-effect transistor interconnected between a second power supply terminal and the conjunction node of said first and second pairs of series-connected field-effect transistors; and
    two field-effect transistors having the opposite conductivity types each other connected in parallel one terminal of which is applied with said second signal and the other end of which is connected to an input terminal of said flip-flop, signals which have the opposite logical relationship each other and each of which is derived from logic gate train means being applied to each gate of said two field-effect transistors, the input of said logic gate train means being connected to said conjunction node of said first and second pair of series-connected field-effect transistors.

11. A memory device as set forth in claim 1 wherein said detector means comprises:
  a flip-flop;
  a first pair of series-connected field-effect transistors one terminal of which is connected to a first power supply terminal, said second signal being applied to the gate of one of said field-effect transistors and the output from said flip-flop being applied to the gate of the other of said field-effect transistors;
  a second pair of series-connected field-effect transistors one terminal of which is connected to said first power supply terminal, said third signal being applied to the gate of one of said second pair of series-connected field-effect transistors and a signal which has the opposite logical relationship with the output from said flip-flop being applied to the gate of the other of said second pair of series-connected field-effect transistors;
  a load field-effect transistors interconnected between a second power supply terminal and the conjunction node of said first and second pairs of series-connected field-effect transistors; and
  two field-effect transistors two of one ends of which are applied with said second and third signals and two of the other ends of which are connected to the input and output terminals of said flip-flop, respectively, signals which are derived from logic gate means whose input is connected to said conjunction node of said first and second pairs of series-connected field-effect transistors being applied to the gates of said two field-effect transistors.

12. A memory device as set forth in claim 1 wherein said detector means comprises:
  a flip-flop;
  a first pair of series-connected field-effect transistors one terminal of which is connected to a first power supply terminal, said second signal being applied to the gate of one of said field-effect transistors and the output from said flip-flop being applied to the gate of the other said field-effect transistors;
  a second pair of series-connected field-effect transistors one terminal of which is connected to said first power supply terminal, said third signal being applied to the gate of one of said second pair of series-connected field-effect transistors and a signal which has the opposite logical relationship with the output from said flip-flop being applied to the gate of the other of said second pair of series-connected field-effect transistors;
  a load field-effect transistors interconnected between a second power supply terminal and the conjunction node of said first and second pairs of series-connected field-effect transistors; and
  two field-effect transistors two of one ends of which are applied with said second and third signals and two of the other ends of which are connected to the input and output terminals of said flip-flop, respectively, signals which are derived from inverter means whose input is connected to said conjunction node of said first and second pairs of series-connected field-effect transistors being applied to the gates of said two field-effect transistors.

13. A memory device as set forth in claim 4 wherein said detector means comprises:
  a first logic gate to which are applied said third signal and said fourth signal derived through a predetermined number of inverters;
  a second logic gate to which are applied said second signal and said first signal derived through inverters the number of which is equal to said predetermined number of inverters;
  a third logic gate to which are applied said first signal and the output derived from said first logic gate;
  a fourth logic gate to which are applied said fourth signal and the output derived from said second logic gate; and
  a fifth logic gate to which are applied the output signals derived from said third and fourth logic gates.

14. A memory device as set forth in claim 1 wherein said detector means comprises:
  an inverter train to which is applied said first signal as an input;
  a first logic gate to which are applied said second signal and a signal which is applied to the last inverter of said inverter train;
  a second logic gate to which are applied said third signal and the output signal derived from said inverter train;
  a first pair of series-connected field-effect transistors one terminal of which is connected to a first power supply terminal, the output signal derived from said first logic gate and said first signal being applied to the gates, respectively, of said series-connected field-effect transistors;
  a second pair of series-connected field-effect transistors one terminal of which is connected to said first power supply terminal, the output signal derived from said second logic gate and the output signal derived from the first inverter of said inverter train being applied to the gates, respectively, of said second pair of series-connected field-effect transistors;
  a load field-effect transistor interconnected between a second power supply terminal and the conjunction node of said first and second pairs of series-connected field-effect transistors; and
  a logic gate the input terminal of which is connected to said conjunction node of said first and second pairs of series-connected field-effect transistors.

15. A memory device as set forth in claim 4 wherein said detector means comprises:
  a first pair of series-connected field-effect transistors one terminal of which is connected through a field-effect transistor to a first power supply terminal, the inverted signal of said second signal and said first signal being applied to the gates, respectively, of said first pair of series-connected field-effect transistors;
  a second pair of series-connected field-effect transistors one terminal of which is connected through a field-effect transistor to said first power supply terminal, said fourth signal and the inverted signal of said third signal being applied to the gates, respectively, of said second pair of series-connected field-effect transistors;

a load field-effect transistor which is interconnected between a second power supply terminal and the conjunction node of said first and second pairs of series-connected field-effect transistors; and a logic gate the input terminal of which is connected to said conjunction node of said first and second pairs of series-connected field-effect transistors.

16. A memory device as set forth in claim 4 wherein said detector means comprises:

a first pair of series-connected field-effect transistors one terminal of which is connected to a first power supply terminal, the inverted signal of said second signal and said first signal being applied to the gates, respectively, of said series-connected field-effect transistors; a second pair of series-connected field-effect transistors one terminal of which is connected to said first power supply terminal, the inverted signal of said third signal and said fourth signal being applied to the gates, respectively, of said second pair of series-connected field-effect transistors;

a load field-effect transistor which is interconnected between a second power supply terminal and the conjunction node of said first and second pairs of series-connected field-effect transistors; and a logic gate the input terminal of which is connected to said conjunction node of said first and second pairs of series-connected field-effect transistors.

17. A memory device as set forth in claim 1 wherein said detector means comprises:

an inverter train an input of which is applied with said first signal;

a first circuit in which a first field-effect transistor whose gate is applied with the input signal applied to the last inverter of said inverter train and a second field-effect transistor whose gate is applied with an inverted signal of said second signal are connected in parallel between a first power supply terminal and a first node and in which a third field-effect transistor whose gate is applied with said first signal is interconnected between said first node and a second node;

a second circuit in which a fourth field-effect transistor whose gate is applied with the output signal derived from the last inverter of said inverter train and a fifth field-effect transistor whose gate is applied with the inverted signal of said third signal are connected in parallel between said first power supply terminal and a third node and in which a sixth field transistor whose gate is applied with the output signal derived from the first inverter of said inverter train is interconnected between second and third nodes;

a load field-effect transistor interconnected between said second node and a second power supply terminal; and a logic gate the input terminal of which is connected to said second node.

18. A memory device as set forth in claim 1 wherein said detector means comprises:

a flip-flop;

a first pair of series-connected field-effect transistors one terminal of which is connected to a first power supply terminal, the output signal derived from said flip-flop and said second signal being applied to the gates, respectively, of said series-connected field-effect transistors;

a second pair of series-connected field-effect transistors one terminal of which is connected to said first power supply terminal, said third signal and the inverted signal of the output signal derived from said flip-flop being applied to the gates, respectively, of said second pair of series-connected field-effect transistors;

load field-effect transistor interconnected between a second power supply terminal and the conjunction node of said first and second pairs of series-connected field-effect transistors; and two field-effect transistors having the opposite conductivity types each other connected in parallel whose gates are applied with the signals which are derived from a logic gate train means and which have the opposite logical relationship with each other, said first signal being applied to one common terminal of said two field-effect transistors and the other common terminal of said two field-effect transistors being connected to the input terminal of said flip-flop.

19. A memory device as set forth in claim 1 wherein said detector means comprises:

a flip-flop;

a first pair of series-connected field-effect transistors one terminal of which is connected to a first power supply terminal, the output signal derived from said flip-flop and said second signal being applied to the gates, respectively, of said series-connected field-effect transistors;

a second pair of series-connected field-effect transistors one terminal of which is connected to said first power supply terminal, said third signal and the inverted signal of the output signal derived from said flip-flop being applied to the gates, respectively, of said second pair of series-connected field-effect transistors;

a load field-effect transistor interconnected between a second power supply terminal and the conjunction node of said first and second pairs of series-connected field-effect transistors; and two field-effect transistors whose gates are applied with the signal derived from a logic gate whose input terminal is connected to said conjunction node of said first and second pairs of series-connected field-effect transistors, said first and fourth signals being applied to the gates, respectively, of said two field-effect transistors and drain outputs thereof being applied to the input and output terminals of said flip-flop, respectively.

* * * * *

UNITED STATES PATENT AND TRADEMARK OFFICE
CERTIFICATE OF CORRECTION

PATENT NO.: 4,592,028
DATED: May 27, 1986
INVENTOR(S): Satoshi Konishi

It is certified that an error appears in the above-identified patent and that said Letters Patent is hereby corrected as shown below:

In Col. 13, lines 42-43, please change "and second signals" to --signal--.

Signed and Sealed this

Seventeenth Day of November, 1998

Attest:

BRUCE LEHMAN

Attesting Officer

Commissioner of Patents and Trademarks